(12) United States Patent
Wang et al.

(10) Patent No.: US 12,211,802 B2
(45) Date of Patent: *Jan. 28, 2025

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Jhih-Yu Wang, New Taipei (TW); Hung-Jui Kuo, Hsinchu (TW); Yu-Hsiang Hu, Hsinchu (TW); Sih-Hao Liao, New Taipei (TW); Yung-Chi Chu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/318,729

(22) Filed: May 17, 2023

(65) Prior Publication Data
US 2023/0290733 A1   Sep. 14, 2023

Related U.S. Application Data

(63) Continuation of application No. 16/354,169, filed on Mar. 14, 2019, now Pat. No. 11,694,967.

(51) Int. Cl.
| H01L 23/544 | (2006.01) |
| H01L 21/48  | (2006.01) |
| H01L 21/56  | (2006.01) |
| H01L 21/78  | (2006.01) |
| H01L 23/00  | (2006.01) |

(Continued)

(52) U.S. Cl.
CPC ........ *H01L 23/544* (2013.01); *H01L 21/4853* (2013.01); *H01L 21/4857* (2013.01); *H01L 21/565* (2013.01); *H01L 21/568* (2013.01); *H01L 21/78* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2223/54426* (2013.01); *H01L 2224/214* (2013.01)

(58) Field of Classification Search
CPC ............... H01L 23/544; H01L 23/5383; H01L 23/5386; H01L 23/5389
See application file for complete search history.

(56) References Cited

U.S. PATENT DOCUMENTS

| 9,000,584 B2 | 4/2015 | Lin et al. |
| 9,048,222 B2 | 6/2015 | Hung et al. |
| 9,048,233 B2 | 6/2015 | Wu et al. |

(Continued)

*Primary Examiner* — Michele Fan
(74) *Attorney, Agent, or Firm* — JCIPRNET

(57) ABSTRACT

A package structure includes a plurality of semiconductor die, an insulating encapsulant and a redistribution layer. Each of the plurality of semiconductor dies includes a semiconductor substrate, conductive pads disposed on the semiconductor substrate, conductive posts disposed on the conductive pads, and at least one alignment mark located on the semiconductor substrate. The insulating encapsulant is encapsulating the plurality of semiconductor dies. The redistribution layer is disposed on the insulating encapsulant and electrically connected to the plurality of semiconductor dies.

20 Claims, 29 Drawing Sheets

(51) Int. Cl.
    *H01L 23/31*     (2006.01)
    *H01L 23/538*     (2006.01)

(56) References Cited

U.S. PATENT DOCUMENTS

| | | |
|---|---|---|
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,396,973 B2 * | 7/2016 | Yu .................. H01L 21/565 |
| 9,496,189 B2 | 11/2016 | Yu et al. |
| 11,694,967 B2 * | 7/2023 | Wang ................ H01L 23/544 |
| | | 257/668 |
| 2012/0299159 A1 * | 11/2012 | Chen .................. H01L 23/544 |
| | | 257/E23.179 |
| 2015/0243605 A1 * | 8/2015 | Yasumura ............. H01L 25/50 |
| | | 438/15 |
| 2017/0047296 A1 * | 2/2017 | Watanabe ............ H01L 23/562 |
| 2018/0151507 A1 * | 5/2018 | Chen .................. H01L 21/565 |
| 2018/0301389 A1 * | 10/2018 | Liu ..................... H01L 25/105 |

\* cited by examiner

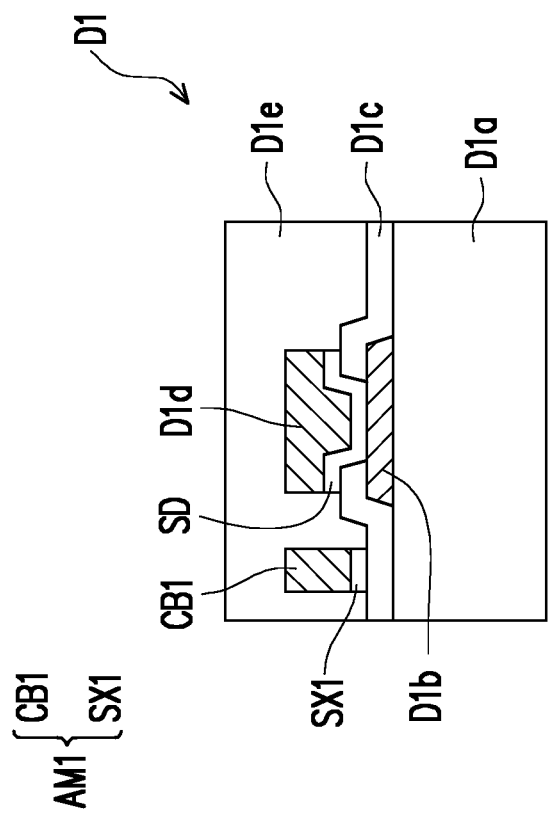
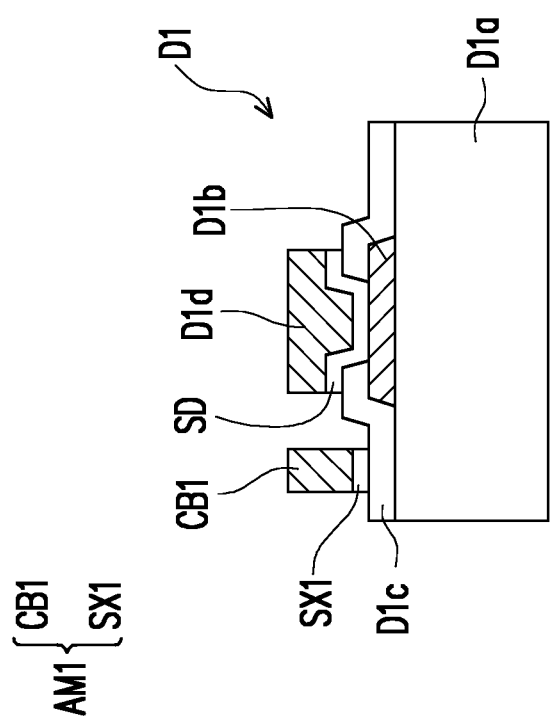
FIG. 1A
FIG. 1B

PACKAGE STRUCTURE AND METHOD OF FABRICATING THE SAME

CROSS-REFERENCE TO RELATED APPLICATION

This application is a continuation application of and claims the priority benefit of U.S. application Ser. No. 16/354,169, filed on Mar. 14, 2019, now allowed. The entirety of the above-mentioned patent application is hereby incorporated by reference herein and made a part of this specification.

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. However, there are many challenges related to integrated fan-out packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 1A and FIG. 1B are schematic sectional views of various stages in a method of fabricating a semiconductor die in accordance with some embodiments of the present disclosure.

DETAILED DESCRIPTION

Figure 2A:
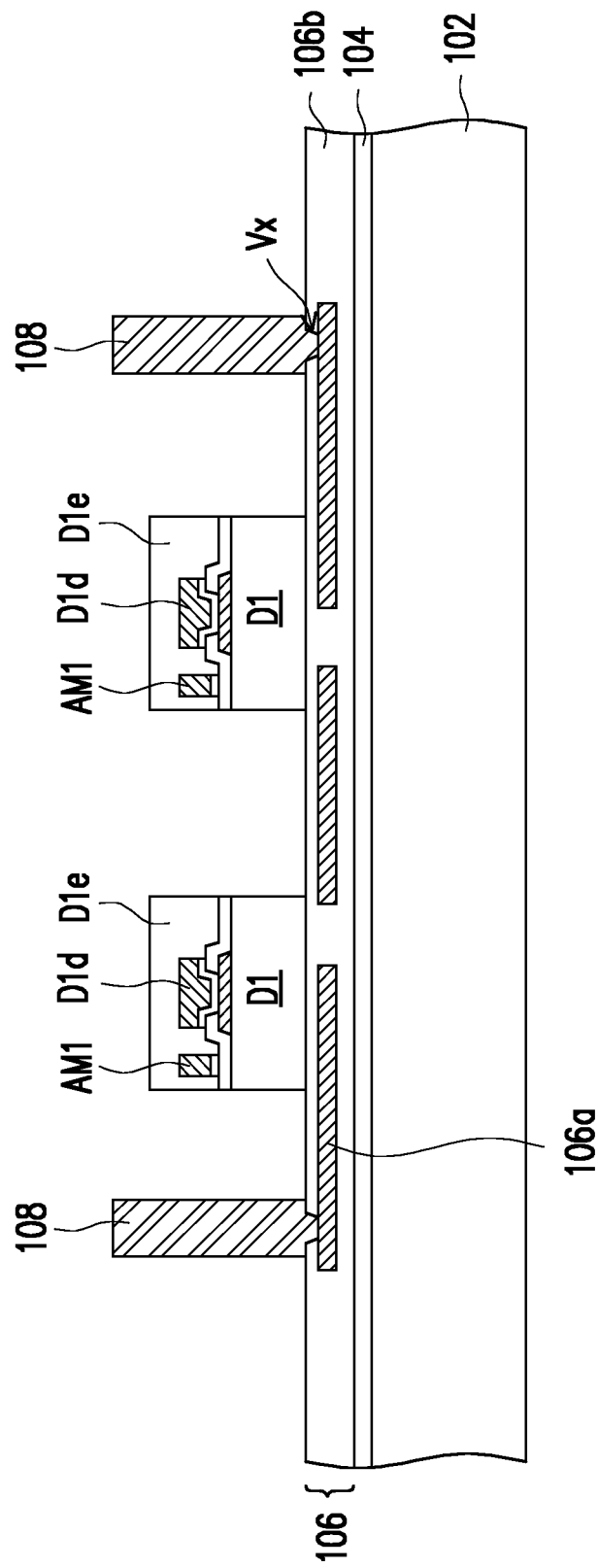
FIG. 2A to FIG. 2G are schematic sectional views of various stages in a method of fabricating a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A and FIG. 1B are schematic sectional views of various stages in a method of fabricating a semiconductor die in accordance with some embodiments of the present disclosure. Referring to FIG. 1A, in some embodiments, a first semiconductor die D1 may be formed by the following steps. For example, a first semiconductor substrate D1a is provided. The first semiconductor substrate D1a may be a bulk silicon substrate or a silicon-on-insulator (SOI) substrate, and further includes active components (e.g., transistors or the like) and optionally passive components (e.g., resistors, capacitors, inductors or the like) formed therein.

After providing the first semiconductor substrate D1a, first conductive pads D1b are formed on the first semiconductor substrate D1a. Although only one first conductive pad D1b is illustrated, it is noted that the number of first conductive pads D1b located on the first semiconductor substrate D1a should be more than one. In some embodiments, the first conductive pads D1b may be aluminum pads, copper pads or other suitable metal pads. After forming the first conductive pads D1b, a first passivation layer D1c is formed over the first semiconductor substrate D1a, wherein the first passivation layer D1c has first openings that partially expose the first conductive pads D1b located on the first semiconductor substrate D1a. In some embodiments, the passivation layer D1c may be a silicon oxide layer, a silicon nitride layer, a silicon oxy-nitride layer or a dielectric layer formed of any suitable dielectric materials. The disclosure is not limited thereto.

In some embodiments, after forming the first passivation layer D1c, first conductive posts D1d are formed on the first conductive pads D1b by plating. For example, the first conductive posts D1d may be formed by forming a seed layer SD over the first passivation layer D1c; forming a mask pattern with openings exposing portions of the seed layer SD; forming a metallic material on the exposed portions of the seed layer SD to form the first conductive posts D1d by plating; removing the mask pattern; and then removing portions of the seed layer SD exposed by the first conductive posts D1d. The remaining seed layer SD will exist in between the first conductive posts D1d and the first conductive pads D1b.

In some embodiments, a first alignment mark AM1 is formed in the same step as forming the first conductive posts D1d. For example, the first alignment mark AM1 is formed with a seed layer SX1 and a conductive body CB1. In some embodiments, the seed layer SX1 and the seed layer SD are formed together in the same steps. In certain embodiments, the conductive body CB1 and the first conductive posts D1d are formed together in the same steps. In some embodiments, the first alignment mark AM1 and the first conductive posts D1d are located at the same level on the first semiconductor substrate D1a. Furthermore, the first alignment mark AM1 and the first conductive posts D1d are made of the same materials. In the exemplary embodiment, the first alignment mark AM1 is formed with a plurality of stripe patterns. For example, the alignment mark AM1 includes a plurality of stripe patterns when observed from a top view. The configuration and design of the stripe patterns will be described in detail later.

Referring to FIG. 1B, in a next step, a first protection layer D1e is optionally formed on the first passivation layer D1c. In some embodiments, the first protection layer D1e covers the first conductive posts D1d and the first alignment mark AM1 so as to protect the first conductive posts D1d and the first alignment mark AM1. Dicing may then be performed to obtain a plurality of the first semiconductor die D1. In the exemplary embodiment, the first semiconductor die D1 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

FIG. 2A to FIG. 2G are schematic sectional views of various stages in a method of fabricating a package structure in accordance with some embodiments of the present disclosure. Referring to FIG. 2A, a carrier 102 with a de-bonding layer 104 coated thereon is provided. In some embodiments, the carrier 102 may be a glass carrier or any suitable carrier for carrying a semiconductor wafer or a reconstituted wafer used for the manufacturing method of the package-on-package structure. In some embodiments, the de-bonding layer 104 may be any material suitable for bonding and de-bonding the carrier 102 from the above layer(s) or any wafer(s) disposed thereon.

In some embodiments, the de-bonding layer 104 may include a dielectric material layer made of a dielectric material including any suitable polymer-based dielectric material (such as benzocyclobutene ("BCB"), polybenzoxazole ("PBO")). In an alternative embodiment, the de-bonding layer 104 may include a dielectric material layer made of an epoxy-based thermal-release material, which loses its adhesive property when heated, such as a light-to-heat-conversion (LTHC) release coating film. In a further alternative embodiment, the de-bonding layer 104 may include a dielectric material layer made of an ultra-violet (UV) glue, which loses its adhesive property when exposed to UV lights. In certain embodiments, the de-bonding layer 104 may be dispensed as a liquid and cured, or may be a laminate film laminated onto the carrier 102. In certain embodiments, the de-bonding layer 104 is, for example, a LTHC layer with good chemical resistance, and such layer enables room temperature de-bonding from the carrier 102 by applying laser irradiation.

After providing the carrier 102 and the de-bonding layer 104, a backside redistribution layer 106 is formed on the de-bonding layer 104. In some embodiments, the backside redistribution layer 106 includes a conductive layer 106a embedded within a dielectric layer 106b. For example, the conductive layer 106a may be constituted by a plurality of redistribution conductive patterns. In some embodiments, the dielectric layer 106b further includes via openings Vx revealing the conductive layer 106a. For simplicity, the dielectric layer 106b is illustrated as one single layer of dielectric layer and the conductive layer 106a is illustrated as embedded in the dielectric layer 106b. However, from the perspective of the manufacturing process, the dielectric layer 106b is constituted by two dielectric layers, and the redistribution conductive layer 106a is sandwiched between the two adjacent dielectric layers. In some embodiments, materials of the conductive layer 106a include aluminum, titanium, copper, nickel, tungsten, and/or alloys thereof. The conductive layer 106a may be formed by, for example, electroplating, deposition, and/or photolithography and etching. In some embodiments, the material of the dielectric layer 106b includes polyimide, epoxy resin, acrylic resin, phenol re sin, benzocyclobutene (BCB), polybenzooxazole (PBO), or any other suitable polymer-based dielectric material. The dielectric layer 106b, for example, may be formed by suitable fabrication techniques such as spin-on coating, chemical vapor deposition (CVD), plasma-enhanced chemical vapor deposition (PECVD), or the like.

It should be noted that the number of the conductive layers 106a and the number of the dielectric layers 106b illustrated in FIG. 2A are merely for illustrative purposes, and the disclosure is not limited thereto. In some alternative embodiments, more layers of the conductive layer and more layers of the dielectric layer may be formed depending on the design requirement. When more layers of conductive layer and more layers of the dielectric layer are adapted, these conductive layers and these dielectric layers are stacked alternately, and the conductive layers are interconnected with one another by the conductive vias.

As illustrated in FIG. 2A, after forming the backside redistribution layer 106, a plurality of the first semiconductor die D1 prepared in FIG. 1B, and a plurality of through insulator vias 108 are provided on the backside redistribution layer 106 over the carrier 102. In some embodiments, the through insulator vias 108 are through integrated fan-out ("InFO") vias. In one embodiment, the formation of the through insulator vias 108 includes forming a mask pattern (not shown) with openings, then forming a metallic material (not shown) filling up the openings by electroplating or deposition, and removing the mask pattern to form the through insulator vias 108 on the backside redistribution layer 106 and within the via openings Vx. In one embodiment, the material of the through insulator vias 108 may include a metal material such as copper or copper alloys, or the like. However, the disclosure is not limited thereto. In an alternative embodiment, the through insulator vias 108 may be formed by forming a seed layer (not shown) on the backside redistribution layer 106; forming the mask pattern with openings exposing portions of the seed layer; forming the metallic material on the exposed portions of the seed layer to form the through insulator vias 108 by plating; removing the mask pattern; and then removing portions of the seed layer exposed by the through insulator vias 108. For example, the seed layer may be a titanium/copper composited layer.

Furthermore, as illustrated in FIG. 2A, a plurality of the first semiconductor dies D1 is placed on the backside redistribution layer 106. Although only two semiconductor dies are illustrated, it should be noted that the number of semiconductor dies placed on the backside redistribution layer 106 is not limited thereto, and this can be adjusted based on design requirement. In some embodiments, the first semiconductor dies D1 are attached or adhered on the backside redistribution layer 106 through a die attach film (DAF), an adhesion paste (not shown) or the like. In certain embodiments, the first semiconductor die D1 is placed onto the carrier 102, and an alignment process is performed using the first alignment mark AM1 for alignment. Since each of the first semiconductor dies D1 includes at least one alignment mark (first alignment mark AM1), the relative positions of each of the first semiconductor dies D1 can be appropriately controlled, and the overlay accuracy of the package structure can be improved.

In the exemplary embodiment, the plurality of first semiconductor dies D1 placed on the backside redistribution layer 106 may be arranged in an array, and when the first semiconductor dies D1 are arranged in an array, the through insulator vias 108 may be classified into groups. The number of the first semiconductor dies D1 may correspond to the number of the groups of the through insulator vias 108. In the illustrated embodiment, the first semiconductor dies D1 may be picked and placed on the backside redistribution layer 106 after the formation of the through insulator vias 108. However, the disclosure is not limited thereto. In some alternative embodiments, the first semiconductor dies D1 may be picked and placed on the backside redistribution layer 106 before the formation of the through insulator vias 108.

Figure 2B:
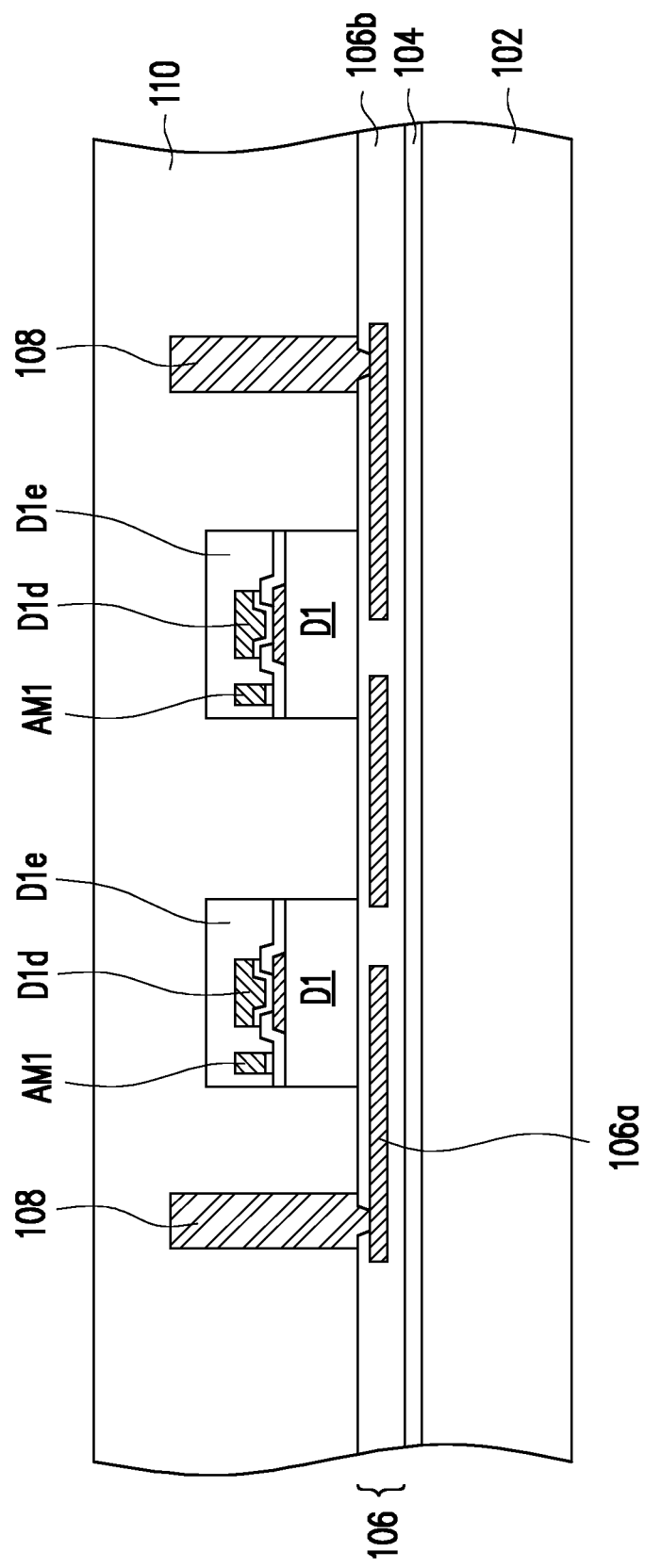

Referring to FIG. 2B, after forming the through insulator vias 108 and providing the first semiconductor dies D1, an insulating material 110 is formed on the backside redistribution layer 106 covering the through insulator vias 108 and the first semiconductor dies D1. In some embodiments, the insulating material 110 is formed through, for example, a compression molding process, filling up the gaps between the first semiconductor dies D1 and adjacent through insulator vias 108 to encapsulate the first semiconductor dies D1. The insulating material 110 also encapsulates the through insulator vias 108. In some embodiments, the first conductive posts D1d and the first protection layer D1e of the first semiconductor dies D1 are encapsulated by and well protected by the insulating material 110. In other words, the first conductive posts D1d and the first protection layer D1e are not revealed and are well protected by the insulating material 110.

In some embodiments, the insulating material 110 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 110 may include an acceptable insulating encapsulation material. In some embodiments, the insulating material 110 may further include inorganic filler or inorganic compound (e.g. silica, clay, and so on) which can be added therein to optimize coefficient of thermal expansion (CTE) of the insulating material 110. The disclosure is not limited thereto.

Figure 2C:
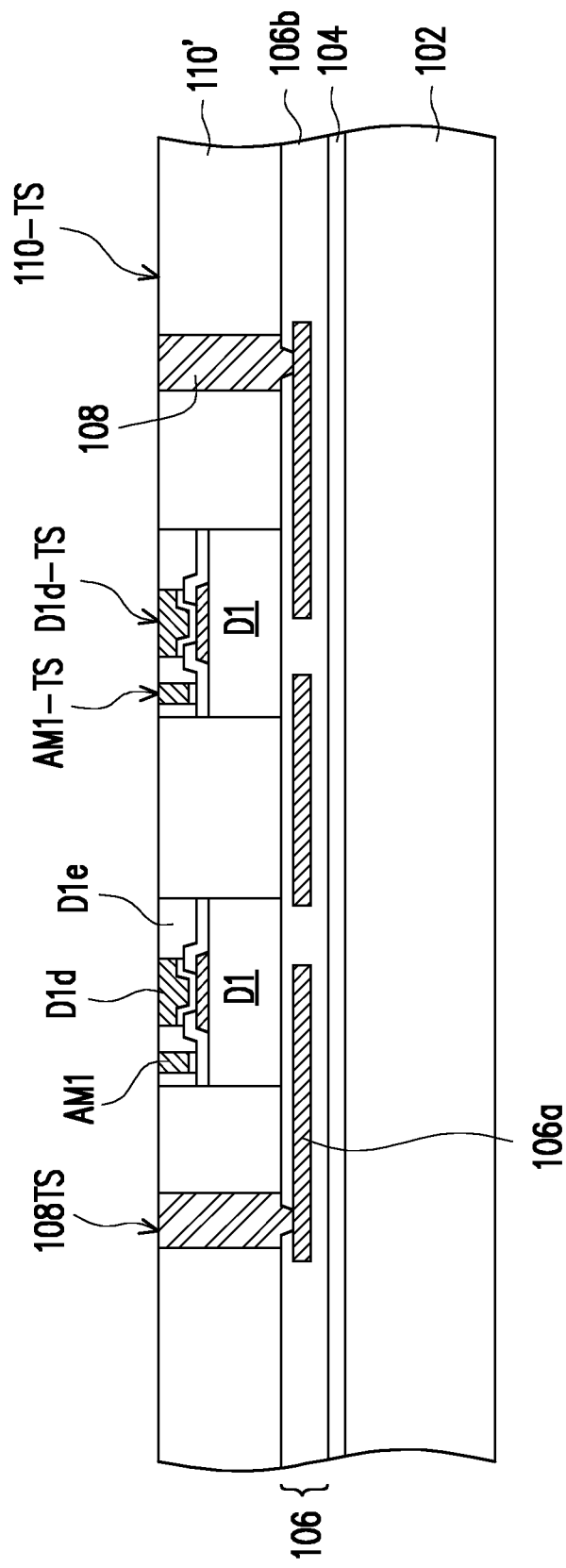

Referring to FIG. 2C, in a next step, the insulating material 110 and the first protection layer D1e of the first semiconductor dies D1 are ground or polished by a mechanical grinding process and/or a chemical mechanical polishing (CMP) process until the top surfaces D1d-TS of the first conductive posts D1d and the top surfaces AM1-TS of the first alignment mark AM1 are revealed. In some embodiments, the through insulator vias 108, the first conductive posts D1d and the first alignment mark AM1 may be partially polished so that the top surface 108-TS of the through insulator vias 108 are levelled with the top surfaces D1d-TS of the first conductive posts D1d and the top surfaces AM1-TS of the first alignment mark AM1. The insulating material 110 is polished to form an insulating encapsulant 110'. In some embodiments, after the polishing process, a top surface 110-TS of the insulating encapsulant 110' is coplanar with the top surface 108-TS of through insulator vias 108, the top surface D1d-TS of the first conductive posts D1d and the top surface AM1-TS of the first alignment mark AM1.

Figure 2D:
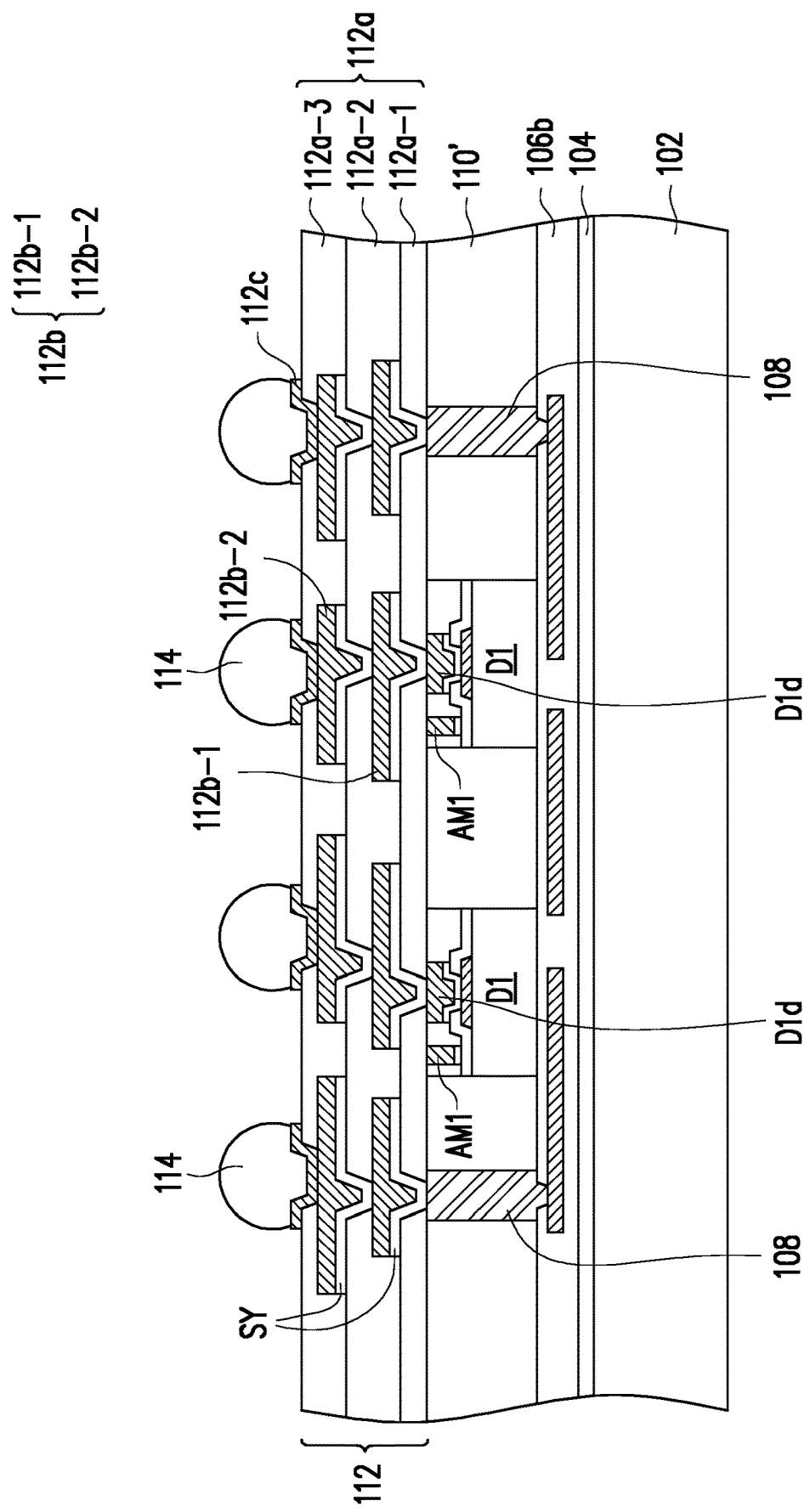

Referring to FIG. 2D, after forming the insulating encapsulant 110', a redistribution layer 112 is formed on the first semiconductor die D1, on the through insulator vias 108, and on the insulating encapsulant 110'. In some embodiments, the redistribution layer 112 is formed on the top surface 108-TS of the through insulator vias 108, on the top surface D1d-TS of the first conductive posts D1d, and on the top surface 110-TS of the insulating encapsulant 110'. In some embodiments, the redistribution layer 112 is electrically connected to the through insulator vias 108, and is electrically connected to the first semiconductor dies D1 through the first conductive posts D1d. In certain embodiments, the first semiconductor dies D1 are electrically connected to the through insulator vias 108 through the redistribution layer 112.

In some embodiments, the formation of the redistribution layer 112 includes sequentially forming one or more dielectric layers 112a, and one or more conductive layers 112b in alternation. In certain embodiments, the conductive layers 112b are sandwiched between the dielectric layers 112a. For example, a first dielectric layer 112a-1 is formed over the insulating encapsulant 110', and the first dielectric layer 112a-1 has contact openings revealing the first conductive posts D1d. Subsequently, a first conductive layer 112b-1 is formed within the contact openings and over the first dielectric layer 112a-1. Thereafter, a second dielectric layer 112a-2, a second conductive layer 112b-2 and a third dielectric layer 112a-3 are sequentially formed in the same way. Although only two layers of the conductive layers 112b and three layers of dielectric layers 112a are illustrated herein, however, the scope of the disclose is not limited by the embodiments of the disclosure. In other embodiments, the number of conductive layers 112b and the dielectric layers 112a may be adjusted based on product requirement. In some embodiments, seed layers SY are formed prior to forming the conductive layers 112b. In other words, the first conductive layer 112b-1 and the second conductive layer 112b-2 are respectively formed on a seed layer SY. In some embodiments, the conductive layers 112b are electrically connected to the conductive posts D1d of the first semiconductor dies D1. Furthermore, the conductive layers 112b are electrically connected to the through insulator vias 108.

In certain embodiments, the material of the dielectric layers 112a may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 112a are formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive layer 112b may be made of conductive materials formed by electroplating or deposition, such as aluminum, titanium, copper, nickel, tungsten, and/or alloys thereof, which may be patterned using a photolithography and etching process. In some embodiments, the conductive layer 112b may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

After forming the redistribution layer 112, a plurality of conductive pads 112c may be disposed on an exposed top surface of the topmost layer of the conductive layers 112b (second conductive layer 112b-2) for electrically connecting with conductive balls. In certain embodiments, the conductive pads 112c are for example, under-ball metallurgy (UBM) patterns used for ball mount. As shown in FIG. 2D, the conductive pads 112c are formed on and electrically connected to the redistribution layer 112. In some embodiments, the materials of the conductive pads 112c may include copper, nickel, titanium, tungsten, or alloys thereof or the like, and may be formed by an electroplating process, for example. The number of conductive pads 112c are not limited in this disclosure, and may be selected based on the design layout. In some alternative embodiments, the conductive pads 112c may be omitted. In other words, conductive balls 114 formed in subsequent steps may be directly disposed on the redistribution layer 112.

As illustrated in FIG. 2D, after forming the conductive pads 112c, a plurality of conductive balls 114 is disposed on the conductive pads 112c and over the redistribution layer 112. In some embodiments, the conductive balls 114 may be disposed on the conductive pads 112c by a ball placement process or reflow process. In some embodiments, the conductive balls 114 are, for example, solder balls or ball grid array (BGA) balls. In some embodiments, the conductive balls 114 are connected to the redistribution layer 112 through the conductive pads 112c. In certain embodiments, some of the conductive balls 114 may be electrically connected to the first semiconductor dies D1 through the redistribution layer 112. Furthermore, some of the conductive balls 114 may be electrically connected to the through insulator vias 108 through the redistribution layer 112. The number of the conductive balls 114 is not limited to the disclosure, and may be designated and selected based on the number of the conductive pads 112c. In some alternative embodiments, an integrated passive device (IPD) (not shown) may optionally be disposed on the redistribution layer 112 and be electrically connected to the redistribution layer 112.

Figure 2E:
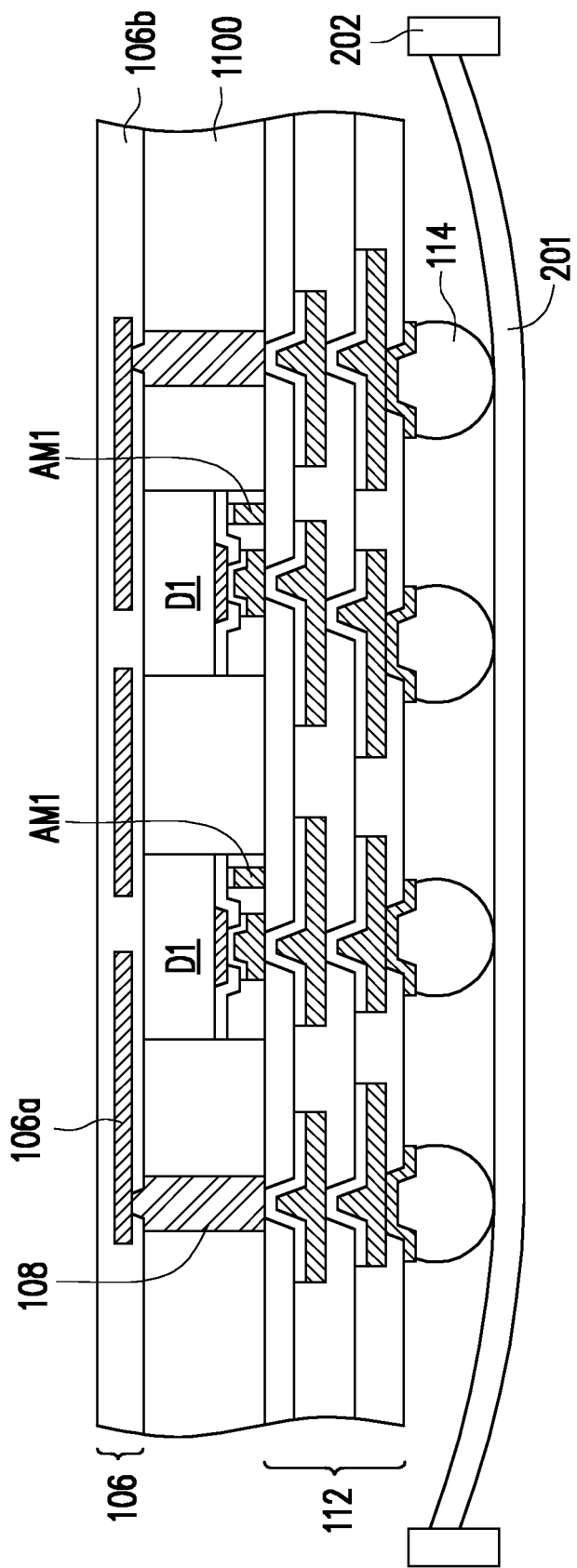

Referring to FIG. 2E, in a next step, after forming the redistribution layer 112 and the conductive balls 114, the structure shown in FIG. 2E may be turned upside down and attached to a tape 201 supported by a frame 202. Subsequently, the carrier 102 is debonded so as to separate the de-bonding layer 104 and the other elements formed thereon from the carrier 102. In the exemplary embodiment, the de-bonding process includes projecting a light such as a laser light or an UV light on the de-bonding layer 104 (e.g., the LTHC release layer), such that the carrier 102 can be easily removed. In certain embodiments, the de-bonding layer 104 may be further removed or peeled off to reveal the backside redistribution layer 106.

Figure 2F:
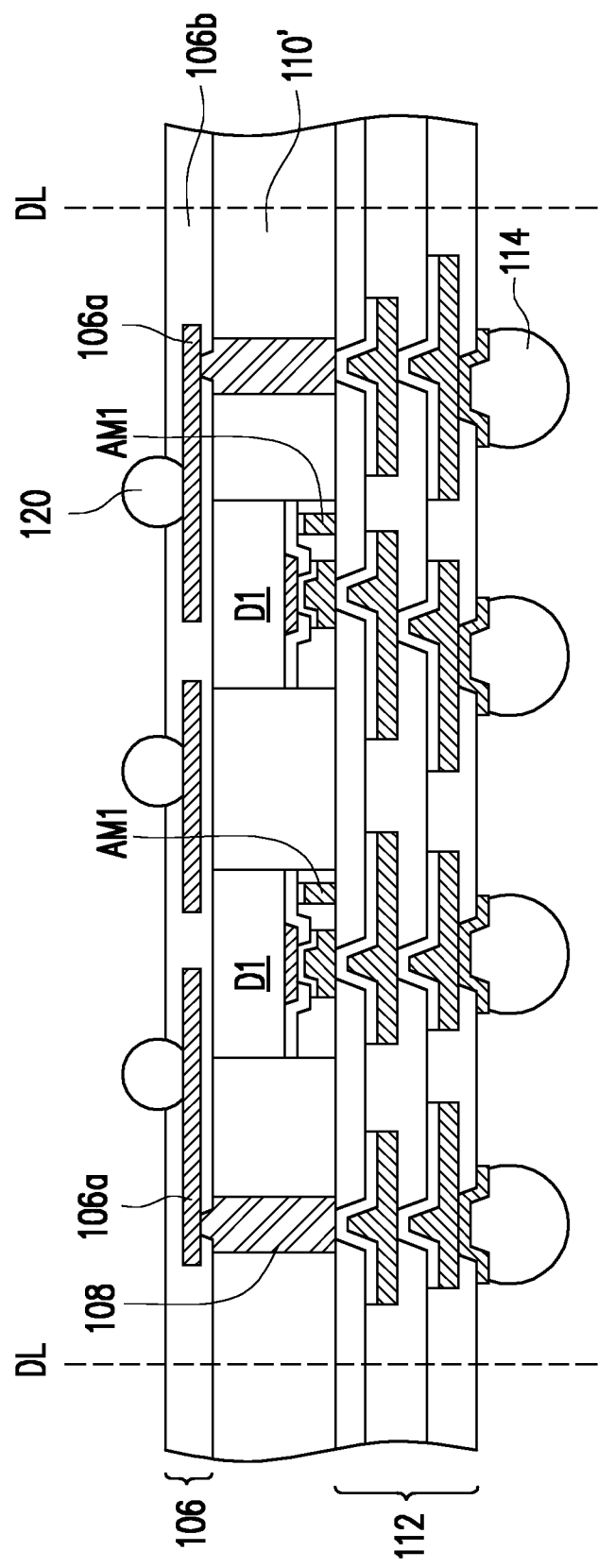
Figure 2G:
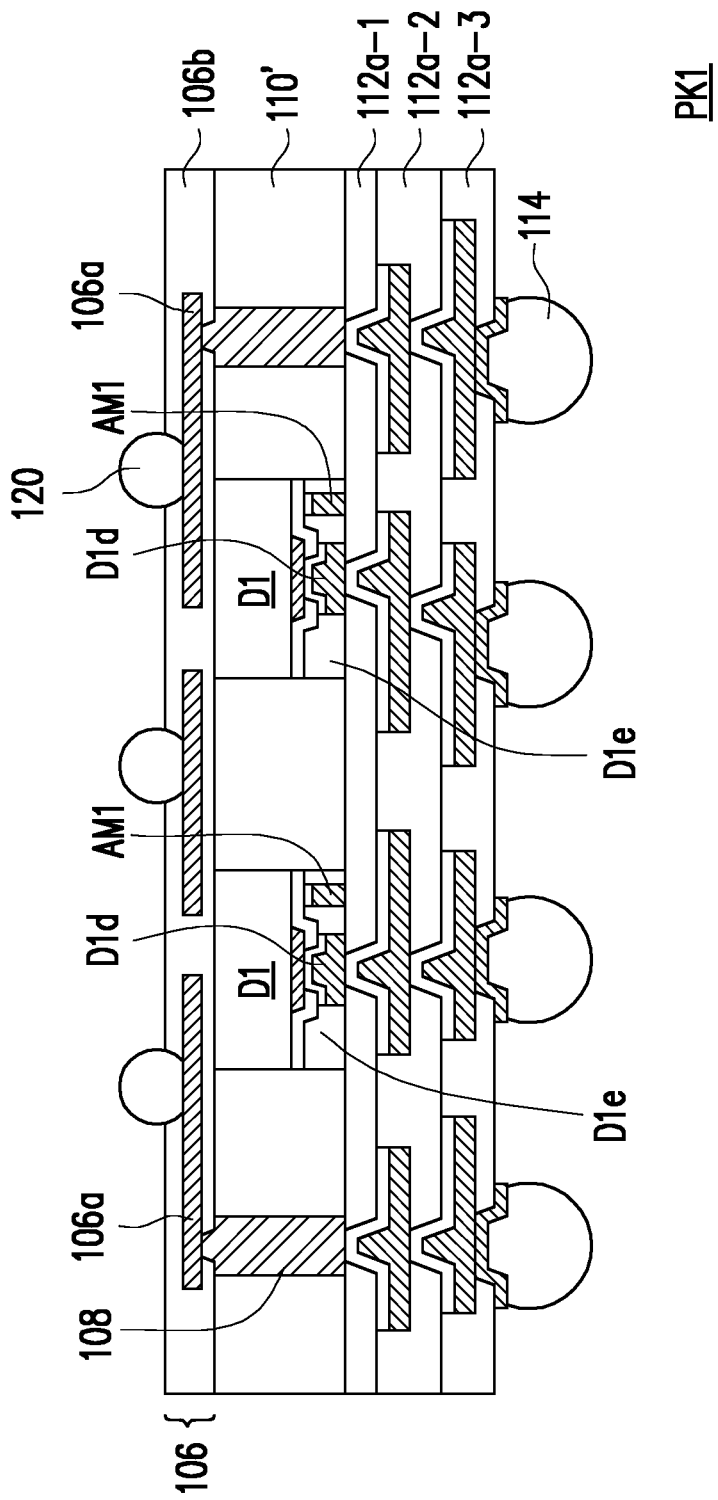

Referring to FIG. 2F, in a next step, the dielectric layer 106b of the backside redistribution layer 106 may be patterned to form a plurality of openings that expose the conductive layers 106a. Thereafter, a plurality of conductive balls 120 may be placed on the surface of the conductive layers 106a exposed by the openings. The conductive balls 120 are, for example, reflowed to bond with the surfaces of the conductive layers 106a. Referring to FIG. 2G, the structure illustrated in FIG. 2F is diced or singulated along the dicing lanes DL to form a plurality of package structures PK1. In some embodiments, the dicing process or the singulation process typically involves dicing with a rotating blade or a laser beam. In other words, the dicing or singulation process is, for example, a laser cutting process, a mechanical cutting process, or other suitable processes. Up to here, a package structure PK1 having dual side terminals is accomplished.

Figure 3:
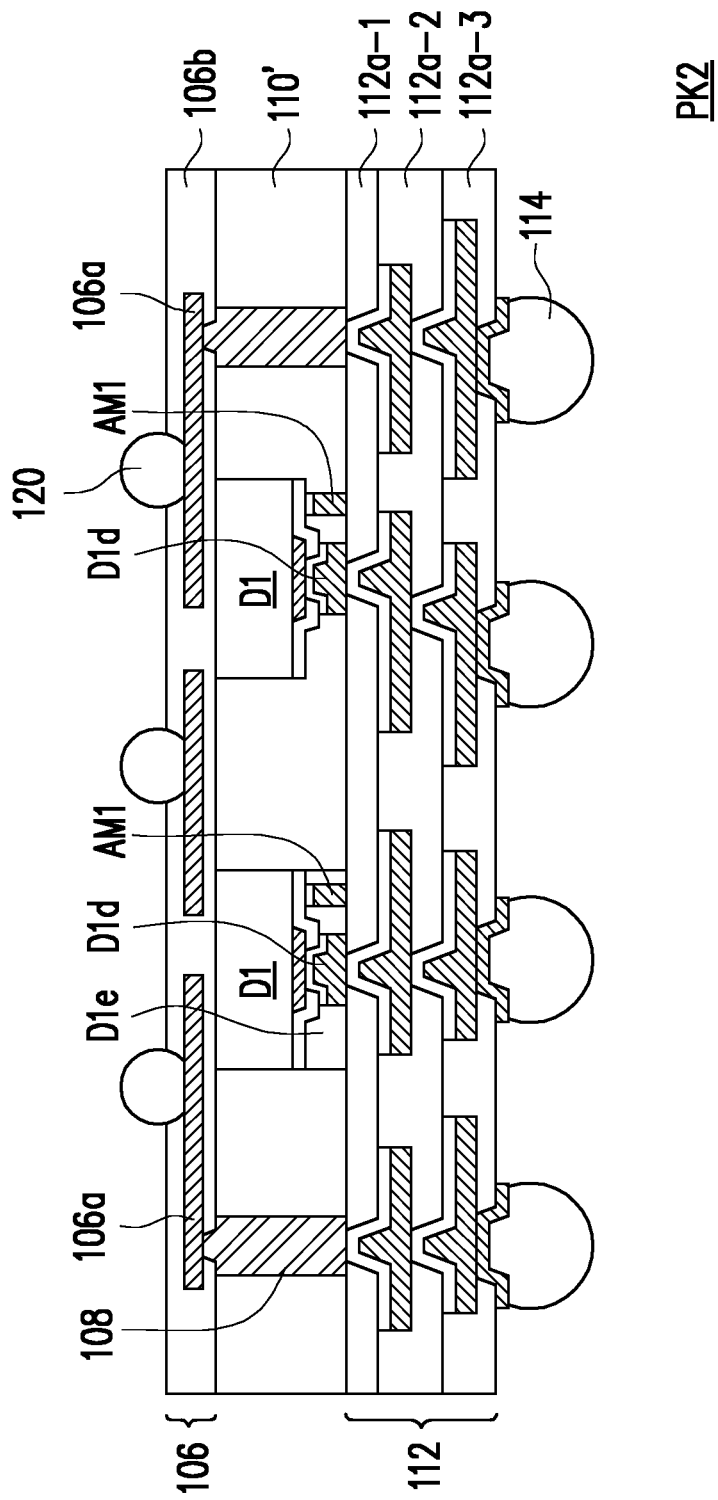
FIG. 3 is a schematic sectional view of a package structure in accordance with some alternative embodiments of the present disclosure.

FIG. 3 is a schematic sectional view of a package structure in accordance with some alternative embodiments of the present disclosure. The package structure PK2 illustrated in FIG. 3 is similar to the package structure PK1 illustrated in FIG. 2G, hence the same reference numerals are used to refer to the same or liked parts, and its detailed description will be omitted herein. The difference between the embodiment shown in FIG. 3 and the embodiment of FIG. 2G is that the first protection layer D1e is omitted from some of the first semiconductor dies D1. In other words, the insulating encapsulant 110' is in direct contact with the first alignment mark AM1 and the first conductive posts D1d. Similar to the embodiment above, since each of the first semiconductor dies D1 includes at least one alignment mark (first alignment mark AM1), the relative positions of each of the first semiconductor dies D1 can be appropriately controlled, and the overlay accuracy of the package structure can be improved.

Figure 4B:
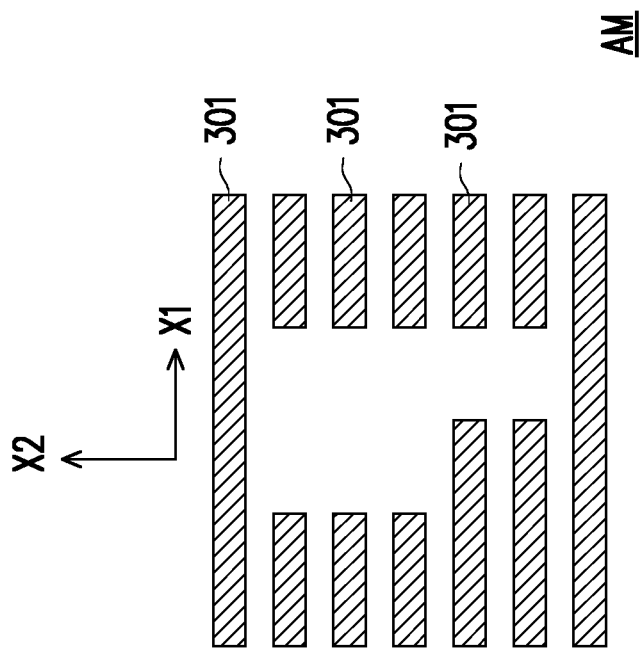
FIG. 4A to FIG. 4D are schematic top views illustrating various configurations of an alignment mark in accordance with some embodiments of the present disclosure.
Figure 4A:
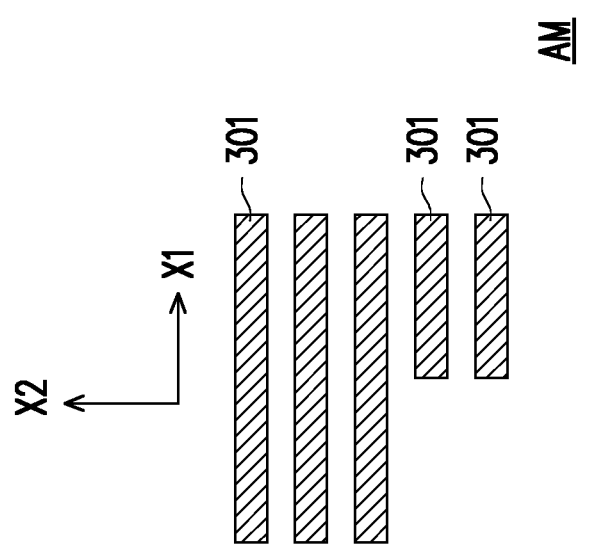

FIG. 4A to FIG. 4D are schematic top views illustrating various configurations of an alignment mark in accordance with some embodiments of the present disclosure. In the embodiments of the present disclosure, the alignment mark having stripe patterns may be any one of the designs shown in FIG. 4A to FIG. 4D. In other words, the first alignment mark AM1 illustrated in the package structure PK1 and the package structure PK2 may be designed to have the stripe patterns shown in FIG. 4A to FIG. 4D. Referring to FIG. 4A, the stripe patterns 301 may have stripes of different lengths, and the stripe patterns 301 are extending along a first direction X1 and sequentially arranged along a second direction X2 that is perpendicular to the first direction X1. In some embodiments, the stripe patterns 301 are arranged to form an alignment mark AM with a L-shaped grid pattern. In some embodiments, the alignment mark AM has a dimension of 1 µm to 20 µm. Herein, the dimension refers to the length or the width of the alignment mark AM from the top view. By adapting the alignment mark AM with the stripe patterns, the signal noise on the alignment mark AM may be sufficiently reduced. That is, the machinery is able to precisely detect the alignment mark AM, thereby enhancing the overlay accuracy and reducing the alignment failure rate. For example, in some embodiments, an overlay accuracy within 0.5 µm may be achieved through the adaption of the stripe patterns.

Figure 4D:
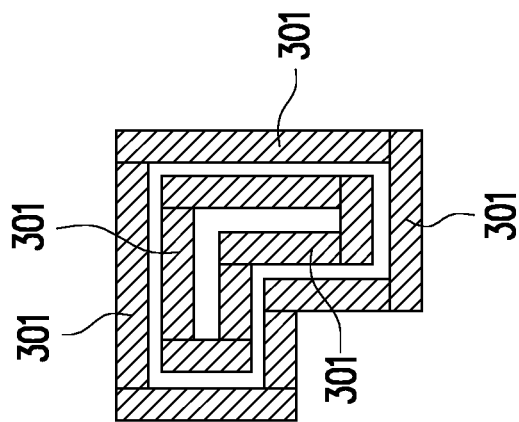
Figure 4C:
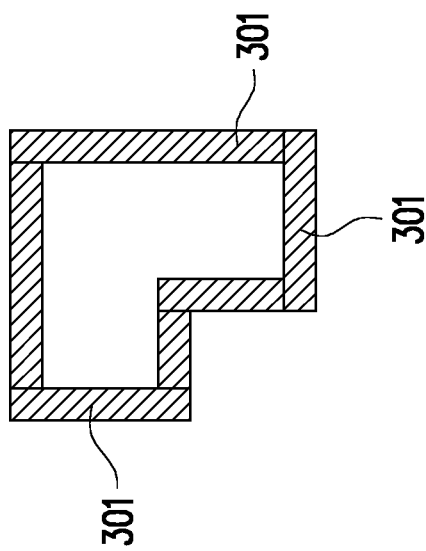

In some alternative embodiments, the alignment mark AM may have other shapes from the top view. For example, referring to FIG. 4B, the stripe patterns 301 together form a square-shaped grid pattern. The square-shaped grid pattern has an L-shaped hollow portion therein. In some embodiments, the machinery may detect the contour of the L-shaped hollow portion based on the stripe patterns 301 for alignment. FIG. 4A and FIG. 4B illustrated that all of the stripe patterns 301 in the alignment mark AM are separated from each other, but the disclosure is not limited thereto. For example, referring to FIG. 4C, the stripe patterns 301 having stripes of different lengths may be connected to form a hollow polygonal shape. In some embodiments, the stripe patterns 301 may be connected to each other to form a L-shaped pattern. Furthermore, referring to FIG. 4D, in some embodiments, a portion of the stripe patterns 301 may be connected to each other to form a first L-shaped pattern. On the other hand, another portion of the stripe patterns 301 are connected to each other to form a second L-shaped pattern encircling the first L-shaped pattern. As illustrated in FIG. 4D, the stripe patterns 301 in the first L-shaped pattern are separated from the stripe patterns 301 in the second L-shaped pattern. By adapting the alignment marks AM of the present disclosure with the stripe patterns, the signal noise on the alignment mark AM may be sufficiently reduced and the overlay accuracy may be sufficiently enhanced.

Figure 5A:
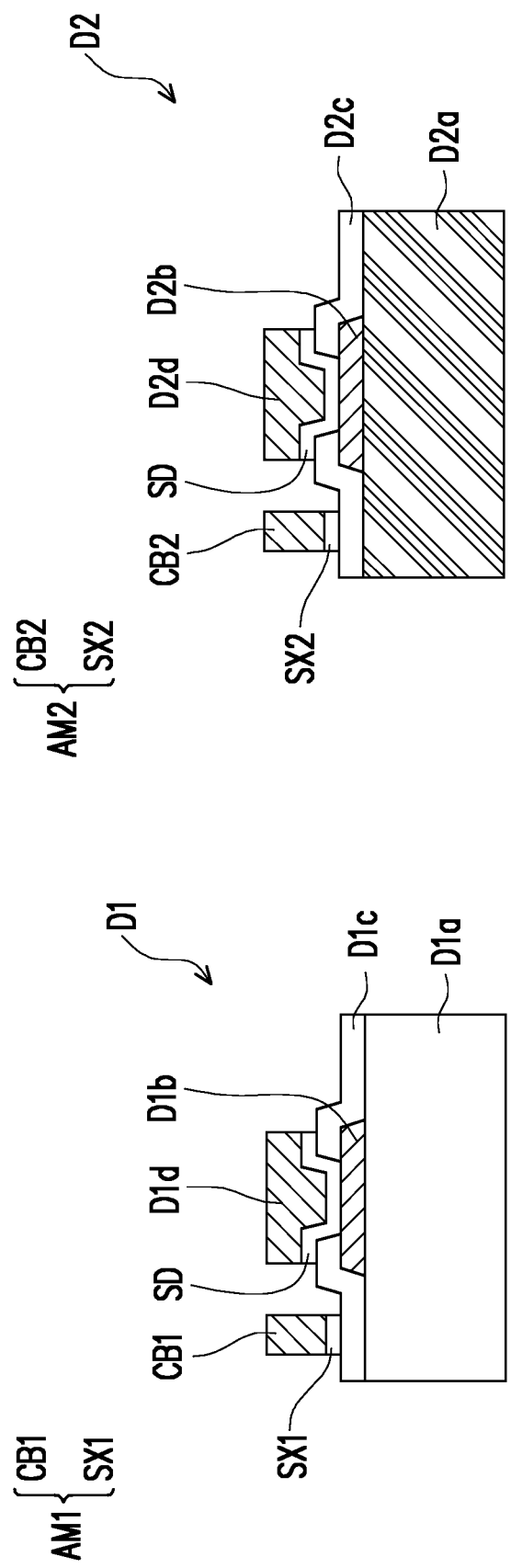
FIG. 5A and FIG. 5B are schematic sectional views of various stages in a method of fabricating semiconductor dies in accordance with some alternative embodiments of the present disclosure.
Figure 5B:
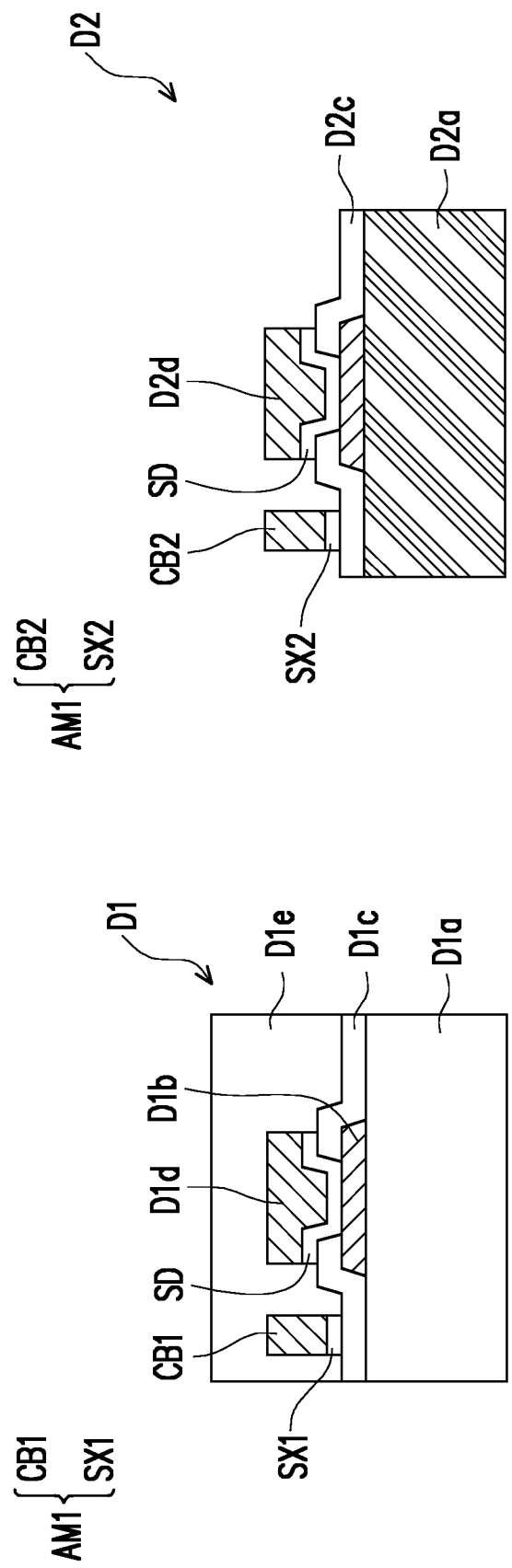

FIG. 5A and FIG. 5B are schematic sectional views of various stages in a method of fabricating semiconductor dies in accordance with some alternative embodiments of the present disclosure. Referring to FIG. 5A and FIG. 5B, a first semiconductor die D1 and a second semiconductor die D2 is fabricated. The first semiconductor die D1 is fabricated in the same way as described in FIG. 1A and FIG. 1B, hence its detailed description will be omitted herein. In the exemplary embodiment, the first semiconductor die D1 and the second semiconductor die D2 are different types of semiconductor dies. For example, in some embodiments, the first semiconductor die D1 may be an application-specific integrated circuit ("ASIC") die, and the second semiconductor die D2 may be a high bandwidth memory (HBM) die, the disclosure is not limited thereto.

The method of fabricating the second semiconductor die D2 is as follows. For example, a second semiconductor substrate D2a is provided. The second semiconductor substrate D2a may be a bulk silicon substrate or a silicon-on-insulator (SOI) substrate, and further includes active components (e.g., transistors or the like) and optionally passive components (e.g., resistors, capacitors, inductors or the like) formed therein.

After providing the second semiconductor substrate D2a, second conductive pads D2b are formed on the second semiconductor substrate D2a. Although only one second conductive pad D2b is illustrated, it is noted that the number of second conductive pads D2b located on the second semiconductor substrate D2a should be more than one. In some embodiments, the second conductive pads D2b may be aluminum pads, copper pads or other suitable metal pads. After forming the second conductive pads D2b, a second passivation layer D2c is formed over the second semiconductor substrate D2a, wherein the second passivation layer D2c has second openings that partially expose the second conductive pads D2b located on the second semiconductor substrate D2a. In some embodiments, the second passivation layer D2c may be a silicon oxide layer, a silicon nitride layer, a silicon oxy-nitride layer or a dielectric layer formed of any suitable dielectric materials. The disclosure is not limited thereto.

In some embodiments, after forming the second passivation layer D2c, second conductive posts D2d are formed on the second conductive pads D2b by plating. For example, the second conductive posts D2d may be formed by forming a seed layer SD over the second passivation layer D2c; forming a mask pattern with openings exposing portions of the seed layer SD; forming a metallic material on the exposed portions of the seed layer SD to form the second conductive posts D2d by plating; removing the mask pattern; and then removing portions of the seed layer SD exposed by the second conductive posts D2d. The remaining seed layer SD will exist in between the second conductive posts D2d and the second conductive pads D2b.

In some embodiments, a second alignment mark AM2 is formed in the same step of forming the second conductive posts D2d. For example, the second alignment mark AM2 is formed with a seed layer SX2 and a conductive body CB2. In some embodiments, the seed layer SX2 and the seed layer SD are formed together in the same steps. In certain embodiments, the conductive body CB2 and the second conductive posts D2d are formed together in the same steps. In some embodiments, the second alignment mark AM2 and the second conductive posts D2d are located at the same level on the second semiconductor substrate D2a. Furthermore, the second alignment mark AM2 and the second conductive posts D2d are made of the same materials. In the exemplary embodiment, the second alignment mark AM2 is formed with a plurality of stripe patterns. For example, the second alignment mark AM2 includes a plurality of stripe patterns when observed from a top view. In certain embodiments, the first alignment mark AM1 and the second alignment mark AM2 may be any one of the designs shown in FIG. 4A to FIG. 4D. In one embodiment, the first alignment mark AM1 and the second alignment mark AM2 may have the same design or configuration. In an alternative embodiment, the first alignment mark AM1 and the second alignment mark AM2 may have different design or configuration.

Referring to FIG. 5B, in a next step, a first protection layer D1e is optionally formed on the first passivation layer D1c, wherein the first protection layer D1e covers the first conductive posts D1d and the first alignment mark AM1 in the first semiconductor die D1. On the other hand, the second conductive posts D1d and the second alignment mark AM2 in the second semiconductor die D2 are not covered by any protection layer. That is, the second conductive posts D1d and the second alignment mark AM2 are revealed. Dicing may then be performed to obtain a plurality of the first semiconductor dies D1 and a plurality of second semiconductor dies D2.

Figure 6A:
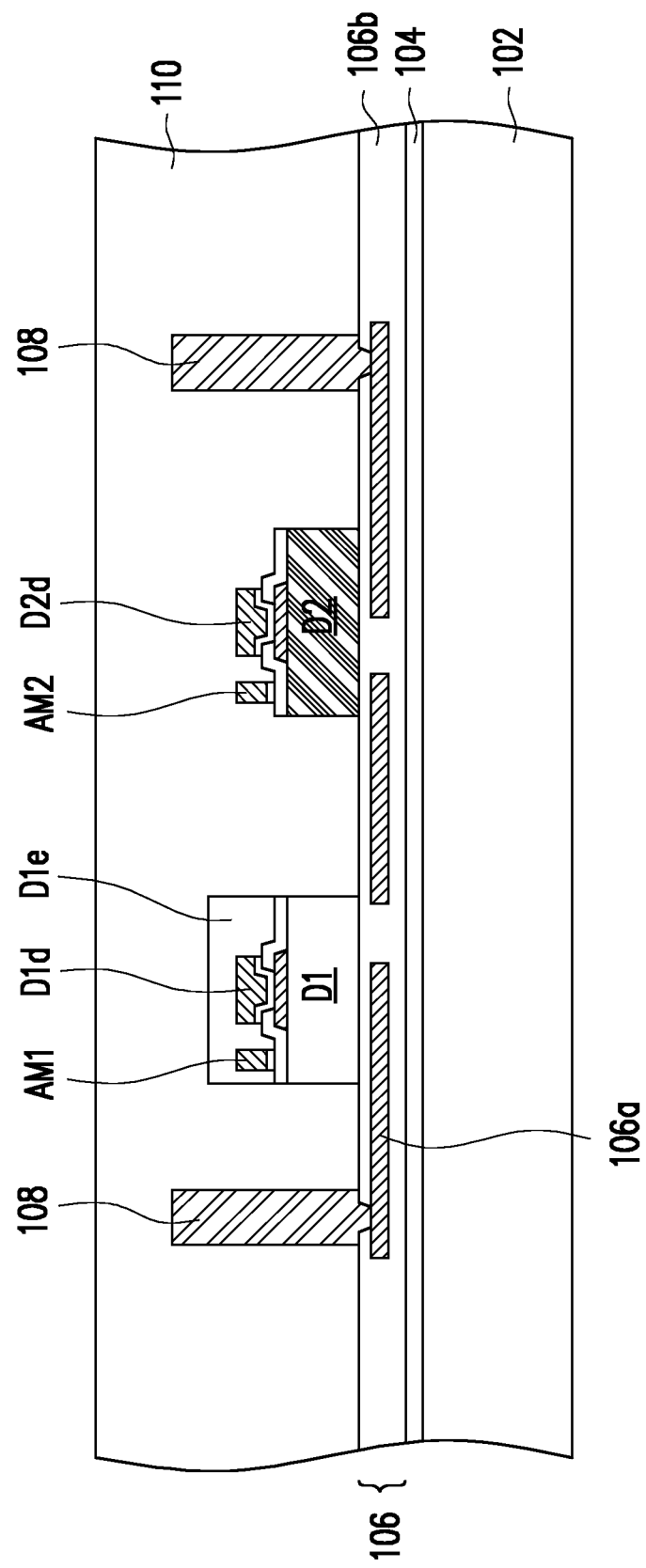
FIG. 6A to FIG. 6C are schematic sectional views of various stages in a method of fabricating a package structure in accordance with some alternative embodiments of the present disclosure.
Figure 6B:
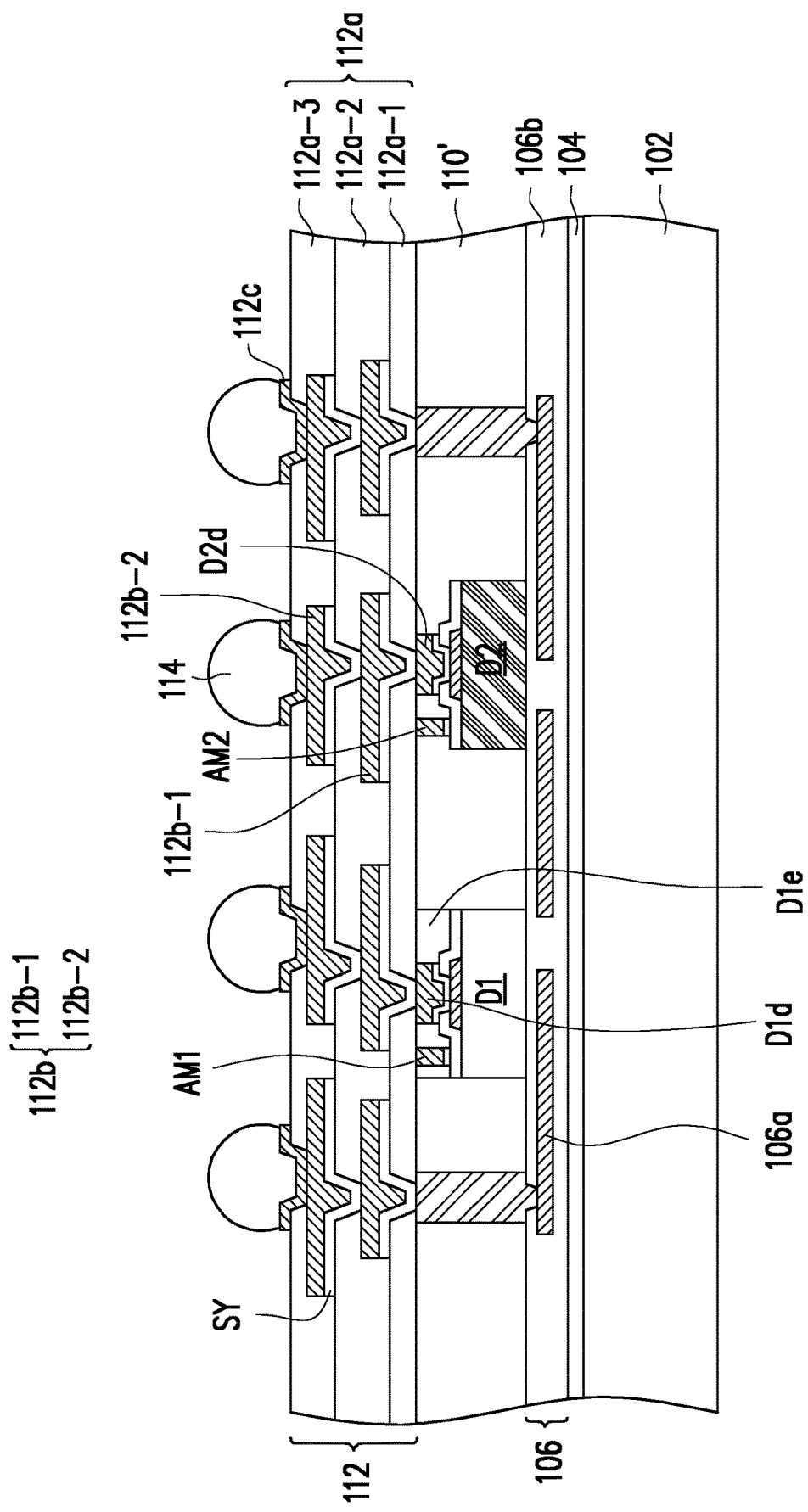
Figure 6C:
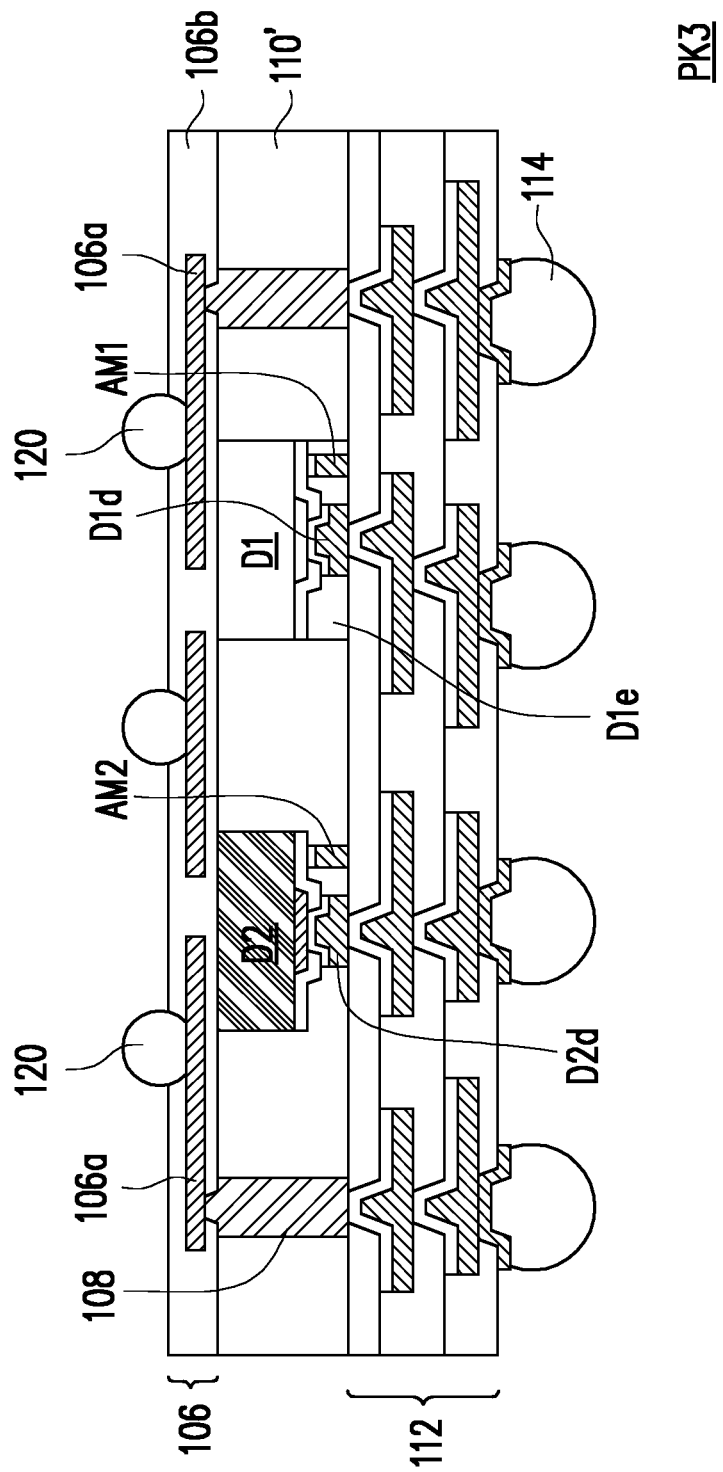

FIG. 6A to FIG. 6C are schematic sectional views of various stages in a method of fabricating a package structure in accordance with some alternative embodiments of the present disclosure. The method of fabricating the package structure shown in FIG. 6A to FIG. 6C is similar to the method shown in FIG. 2A to FIG. 2G, hence the same reference numerals are used to refer to the same or liked parts, and its detailed description will be omitted herein. The difference between the embodiments is that the first semiconductor die D1 and the second semiconductor die D2 prepared in FIG. 5B are used instead.

Referring to FIG. 6A, at least one first semiconductor die D1 and one second semiconductor die D2 prepared in FIG. 5B, and a plurality of through insulator vias 108 are provided on the backside redistribution layer 106 over the carrier 102. In some embodiments, a plurality of through insulator vias 108 are provided on the backside redistribution layer 106 to surround the first semiconductor die D1 and the second semiconductor die D2. Although only two semiconductor dies are illustrated herein, it should be noted that the number of semiconductor dies placed on the backside redistribution layer 106 is not limited thereto, and this can be adjusted based on design requirement. In some embodiments, the first semiconductor die D1 and the second semiconductor die D2 are attached or adhered on the backside redistribution layer 106 through a die attach film (DAF), an adhesion paste (not shown) or the like. In some embodiments, the first semiconductor die D1 is placed onto the carrier 102, and a first alignment process is performed using the first alignment mark AM1 for alignment. In certain embodiments, the second semiconductor die D2 is placed onto the carrier 102, and a second alignment process is performed using the second alignment mark AM2 for alignment.

After forming the through insulator vias 108 and providing the first semiconductor die D1 and the second semiconductor die D2, an insulating material 110 is formed on the backside redistribution layer 106 to cover the through insulator vias 108, the first semiconductor die D1 and the second semiconductor die D2. In some embodiments, the insulating material 110 is formed to encapsulate the first semiconductor die D1 and the second semiconductor die D2. Since a protection layer is omitted from the second semiconductor die D2, the insulating material 110 is formed to be in direct contact with the second conductive posts D2d and the second alignment mark AM2. Furthermore, the insulating material 110 also encapsulates the through insulator vias 108.

Referring to FIG. 6B, after forming the insulating material 110, the insulating material 110 is polished to form an insulating encapsulant 110'. Thereafter, the same steps described in FIG. 2D may be performed to form the redistribution layer 112, the conductive pads 112c and the conductive balls 114. In some embodiments, the redistribution layer 112 is electrically connected to the first conductive posts D1d of the first semiconductor die D1, and electrically connected to the second conductive posts D2d of the second semiconductor die D2. Furthermore, the redistribution layer 112 may be electrically connected to the through insulator vias 108 by the conductive layers 112b.

Referring to FIG. 6C, in a next step, the carrier 102 is debonded so as to separate the de-bonding layer 104 and the other elements formed thereon from the carrier 102. Subsequently, the dielectric layer 106b of the backside redistribution layer 106 may be patterned to form a plurality of openings that expose the conductive layers 106a, and a plurality of conductive balls 120 may be placed on the surface of the conductive layers 106a exposed by the openings. The structure may then be diced or singulated to form a plurality of package structures PK3. Similar to the embodiments above, since each of the first semiconductor die D1 and the second semiconductor die D2 includes at least one alignment mark (first alignment mark AM1 and second alignment mark AM2) used for the alignment process, the relative positions of the first semiconductor die D1 to the second semiconductor die D2 can be appropriately controlled, and the overlay accuracy of the package structure can be improved.

Figure 7A:
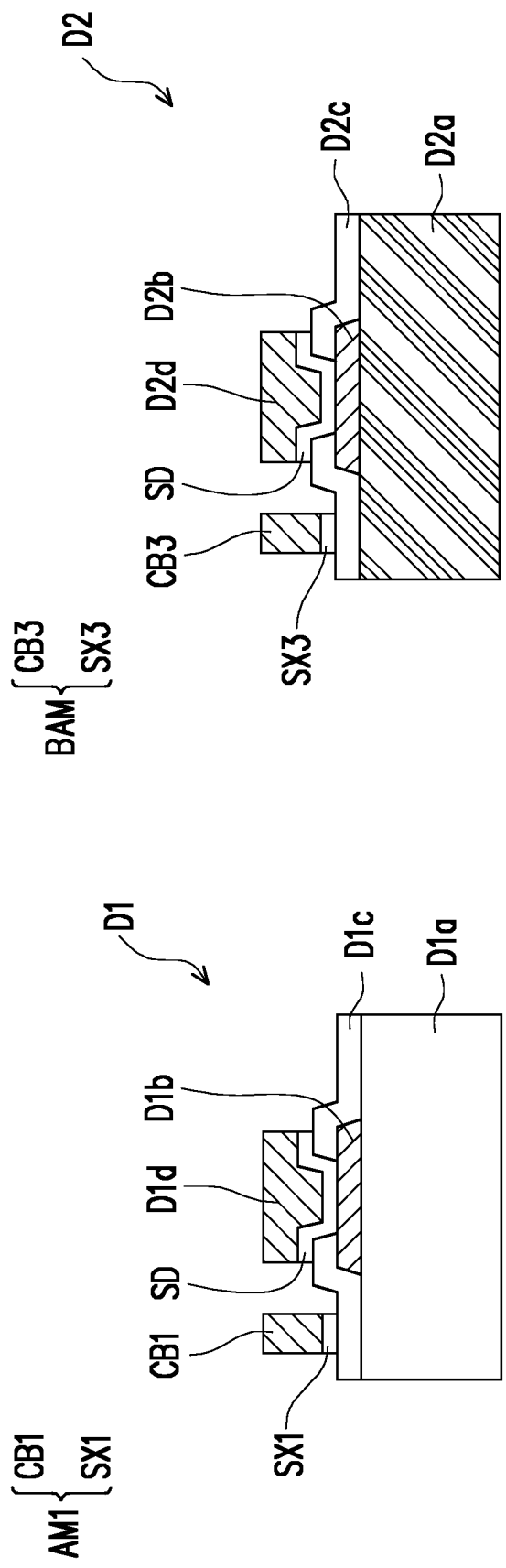
FIG. 7A and FIG. 7B are schematic sectional views of various stages in a method of fabricating semiconductor dies in accordance with some alternative embodiments of the present disclosure.
Figure 7B:
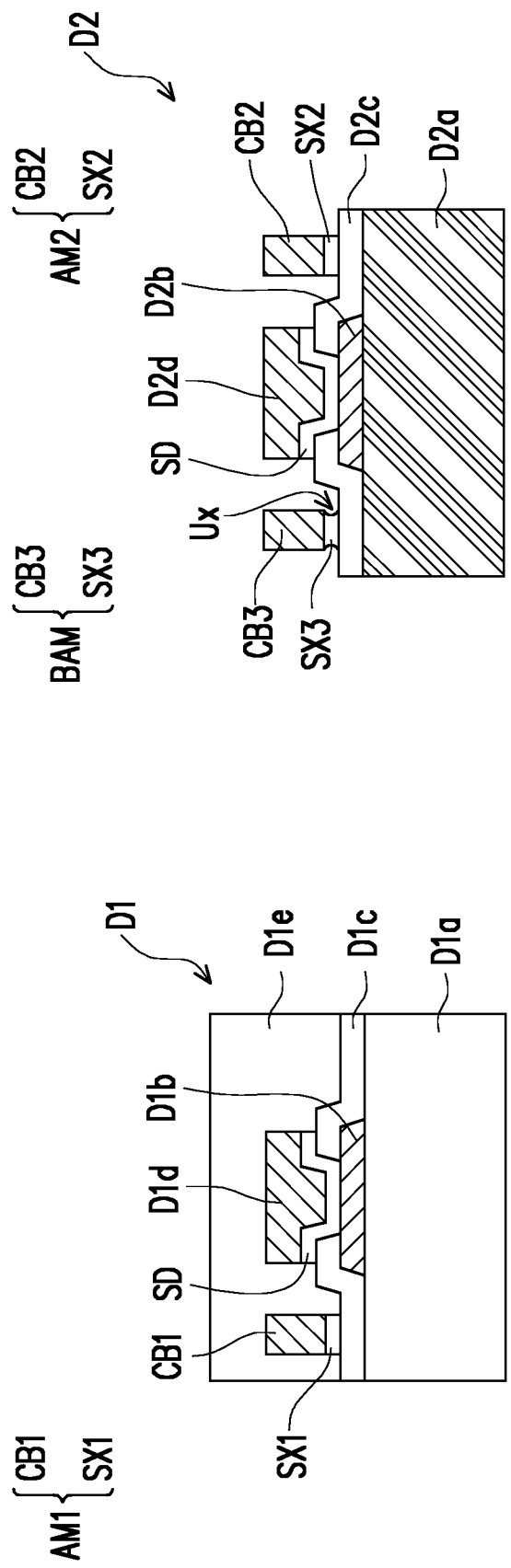

FIG. 7A and FIG. 7B are schematic sectional views of various stages in a method of fabricating semiconductor dies in accordance with some alternative embodiments of the present disclosure. Referring to FIG. 7A and FIG. 7B, a first semiconductor die D1 and a second semiconductor die D2 is fabricated. The method of fabricating the first semiconductor die D1 and the second semiconductor D2 is similar to the method described in FIG. 5A and FIG. 5B, hence the same reference numerals will be used to refer to the same or liked parts, and its detailed description will be omitted herein. The difference being that the second semiconductor die D2 of FIG. 7A and FIG. 7B is fabricated with a bulk alignment mark BAM.

The method of fabricating the second semiconductor die D2 is as follows. Referring to FIG. 7A, a second semiconductor substrate D2a is provided. After providing the second semiconductor substrate D2a, second conductive pads D2b are formed on the second semiconductor substrate D2a. Subsequently, a second passivation layer D2c is formed over the second semiconductor substrate D2a, wherein the second passivation layer D2c has second openings that partially expose the second conductive pads D2b located on the second semiconductor substrate D2a.

In some embodiments, after forming the second passivation layer D2c, second conductive posts D2d are formed on the second conductive pads D2b by plating. Furthermore, in some embodiments, a bulk alignment mark BAM is formed in the same step of forming the second conductive posts D2d on the second passivation layer D2c. For example, the bulk alignment mark BAM is formed with a seed layer SX3 and a conductive body CB3. In some embodiments, the seed layer SX3 and the seed layer SD are formed together in the same steps. In certain embodiments, the conductive body CB3 and the second conductive posts D2d are formed together in the same steps. In some embodiments, the bulk alignment mark BAM and the second conductive posts D2d are located at the same level on the second semiconductor substrate D2a. Furthermore, the bulk alignment mark BAM and the second conductive posts D2d are made of the same materials. In the exemplary embodiment, a "bulk" alignment mark tends to mean that the alignment mark can be viewed primarily as a single mass of material, and it does not have stripe patterns.

Referring to FIG. 7B, in a next step, a second alignment mark AM2 having a plurality of stripe patterns is formed on the second passivation layer D2c. In some embodiments, the second alignment mark AM2 is formed after forming the second conductive posts D2c and the bulk alignment mark BAM. In certain embodiments, the second alignment mark AM2 is formed with a seed layer SX2 and a conductive body CB2. Furthermore, the second alignment mark AM2, the bulk alignment mark BAM and the second conductive posts D2d are located at the same level on the second semiconductor substrate D2a. In some embodiments, during the formation of the second alignment mark AM2, the bulk alignment mark BAM is further etched to form an undercut Ux. In certain embodiments, the seed layer SX3 of the bulk alignment mark BAM is etched to form the undercut Ux. After forming the second alignment mark AM2, dicing may then be performed to form a plurality of the second semiconductor die D2.

Figure 8A:
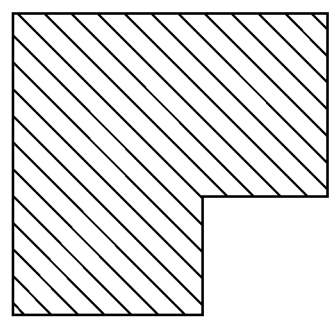
FIG. 8A and FIG. 8B are schematic top views illustrating various configurations of a bulk alignment mark in accordance with some embodiments of the present disclosure.
Figure 8B:
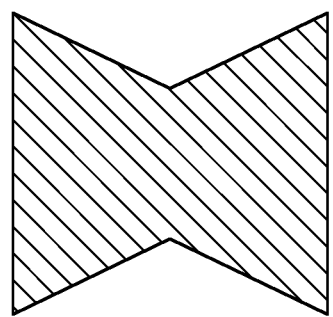

FIG. 8A and FIG. 8B are schematic top views illustrating various configurations of a bulk alignment mark in accordance with some embodiments of the present disclosure. The design of the bulk alignment mark BAM illustrated in FIG. 7A and FIG. 7B is not particularly limited, and can be for example, any one of the designs shown in FIG. 8A and FIG. 8B. Referring to FIG. 8A, the bulk alignment mark BAM is formed with a L-shaped pattern. Referring to FIG. 8B, the bulk alignment mark BAM is formed with a polygonal shape. However, the bulk alignment marks BAM of FIG. 8A and FIG. 8B are formed as a single mass of material, and does not contain any stripe patterns.

Figure 9:
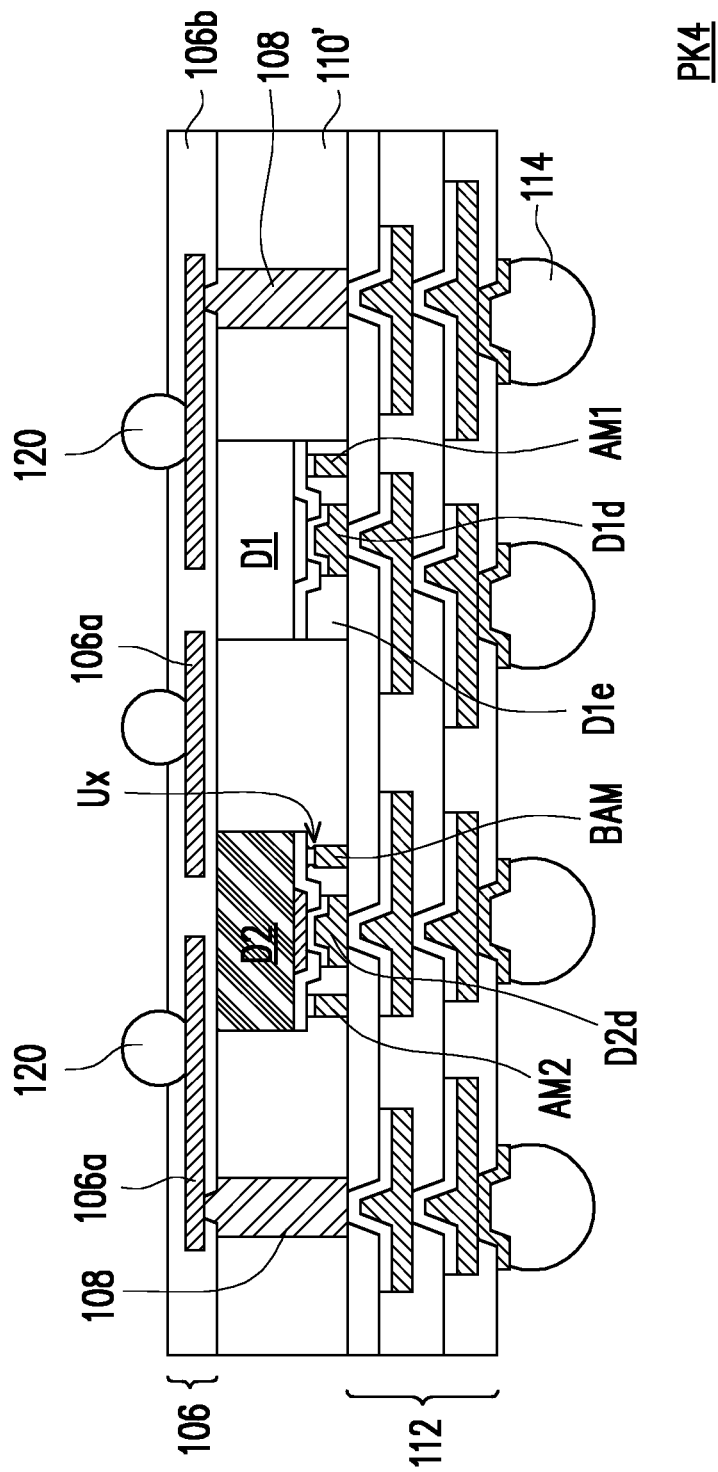
FIG. 9 is a schematic sectional view of a package structure in accordance with some alternative embodiments of the present disclosure.

FIG. 9 is a schematic sectional view of a package structure in accordance with some alternative embodiments of the present disclosure. The package structure PK4 illustrated in FIG. 9 is similar to the package structure PK3 illustrated in FIG. 6C, hence the same reference numerals are used to refer to the same or liked parts, and its detailed description will be omitted herein. The difference between the embodiments is that the first semiconductor die D1 and the second semiconductor die D2 prepared in FIG. 7B are used instead. In other words, the second semiconductor die D2 further contains the bulk alignment mark BAM with the undercut Ux. Similar to the embodiments above, since each of the first semiconductor die D1 and the second semiconductor die D2 includes at least one alignment mark (first alignment mark AM1 and second alignment mark AM2) used for the alignment process, the relative positions of the first semiconductor die D1 to the second semiconductor die D2 can be appropriately controlled, and the overlay accuracy of the package structure can be improved.

Figure 10A:
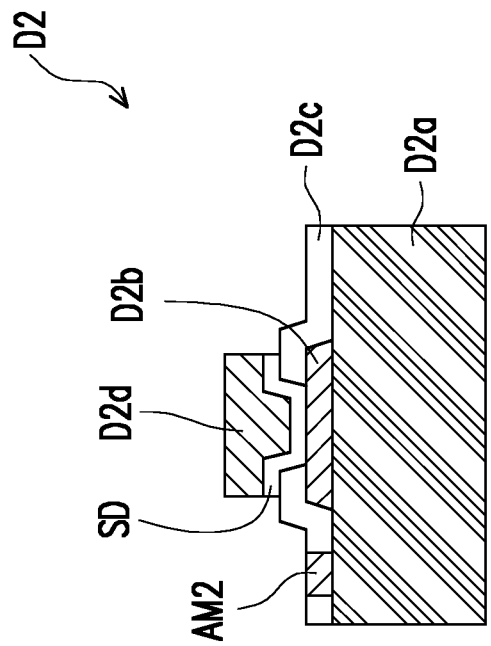
FIG. 10A and FIG. 10B are schematic sectional views of various stages in a method of fabricating semiconductor dies in accordance with some alternative embodiments of the present disclosure.
Figure 10A:
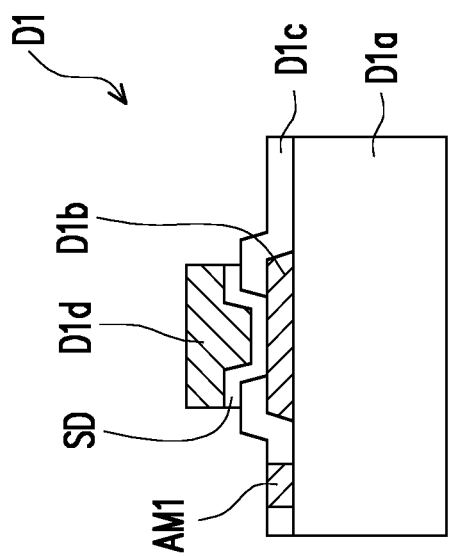
Figure 10B:
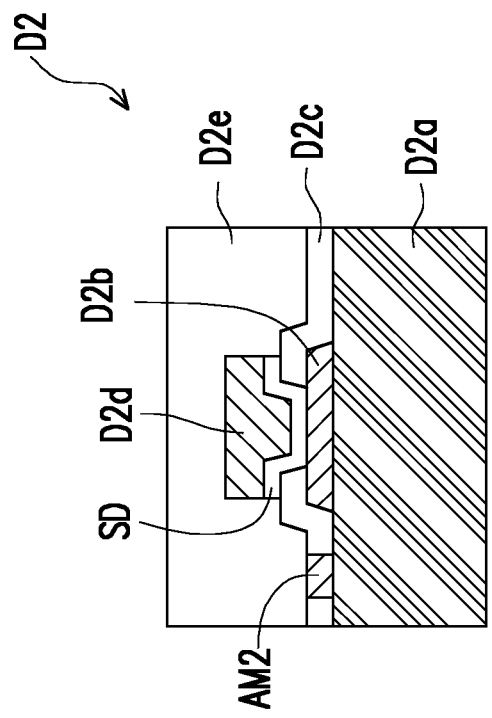
Figure 10B:
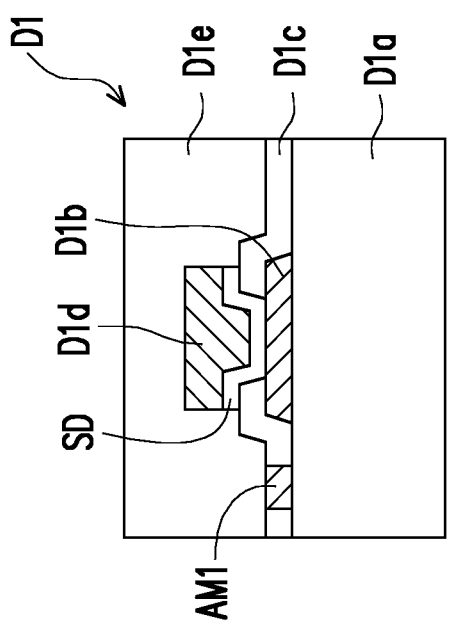

FIG. 10A and FIG. 10B are schematic sectional views of various stages in a method of fabricating semiconductor dies in accordance with some alternative embodiments of the present disclosure. Referring to FIG. 10A and FIG. 10B, a first semiconductor die D1 and a second semiconductor die D2 is fabricated. The method of fabricating the first semiconductor die D1 and the second semiconductor D2 is similar to the method described in FIG. 5A and FIG. 5B, hence the same reference numerals will be used to refer to the same or liked parts, and its detailed description will be omitted herein. The difference between the embodiments is in the position of the first alignment mark AM1 and the second alignment mark AM2.

Referring to FIG. 10A, in the first semiconductor die D1, the first alignment mark AM1 and the first conductive pads D1b are formed together in the same steps. In some embodiments, the first alignment mark AM1 and the first conductive pads D1b are located at the same level on the first semiconductor substrate D1a. Furthermore, the first alignment mark AM1 and the first conductive pads D1b are made of the same materials. Similarly, in the second semiconductor die D2, the second alignment mark AM2 and the second conductive pads D2b are formed together in the same steps. In some embodiments, the second alignment mark AM2 and the second conductive pads D2b are located at the same level on the second semiconductor substrate D2a. Furthermore, the second alignment mark AM2 and the second conductive pads D2b are made of the same materials. In the exemplary embodiment, the first alignment mark AM1 and the second alignment mark AM2 are formed with a plurality of stripe patterns. For example, the first alignment mark AM1 and the second alignment mark AM2 may be any one of the designs shown in FIG. 4A to FIG. 4D.

Referring to FIG. 10B, in a next step, a first protection layer D1e and a second protection layer D2e are optionally formed on the first passivation layer D1c and the second passivation layer D2c respectively. In some embodiments, the first protection layer D1e covers the first conductive posts D1d and the first alignment mark AM1 in the first semiconductor die D1. In certain embodiments, the second protection layer D2e covers the second conductive posts D2d and the second alignment mark AM2 in the second semiconductor die D2. In some embodiments, since the first protection layer D1e and the second protection layer D2e are made of transparent materials, the first alignment mark AM1 covered by the first protection layer D1e, and the second alignment mark AM2 covered by the second protection layer D2e can still be observed, detected and used for alignment. After forming the first protection layer D1e and the second protection layer D2e, dicing may then be performed to form a plurality of the first semiconductor dies D1 and a plurality of the second semiconductor dies D2.

Figure 11:
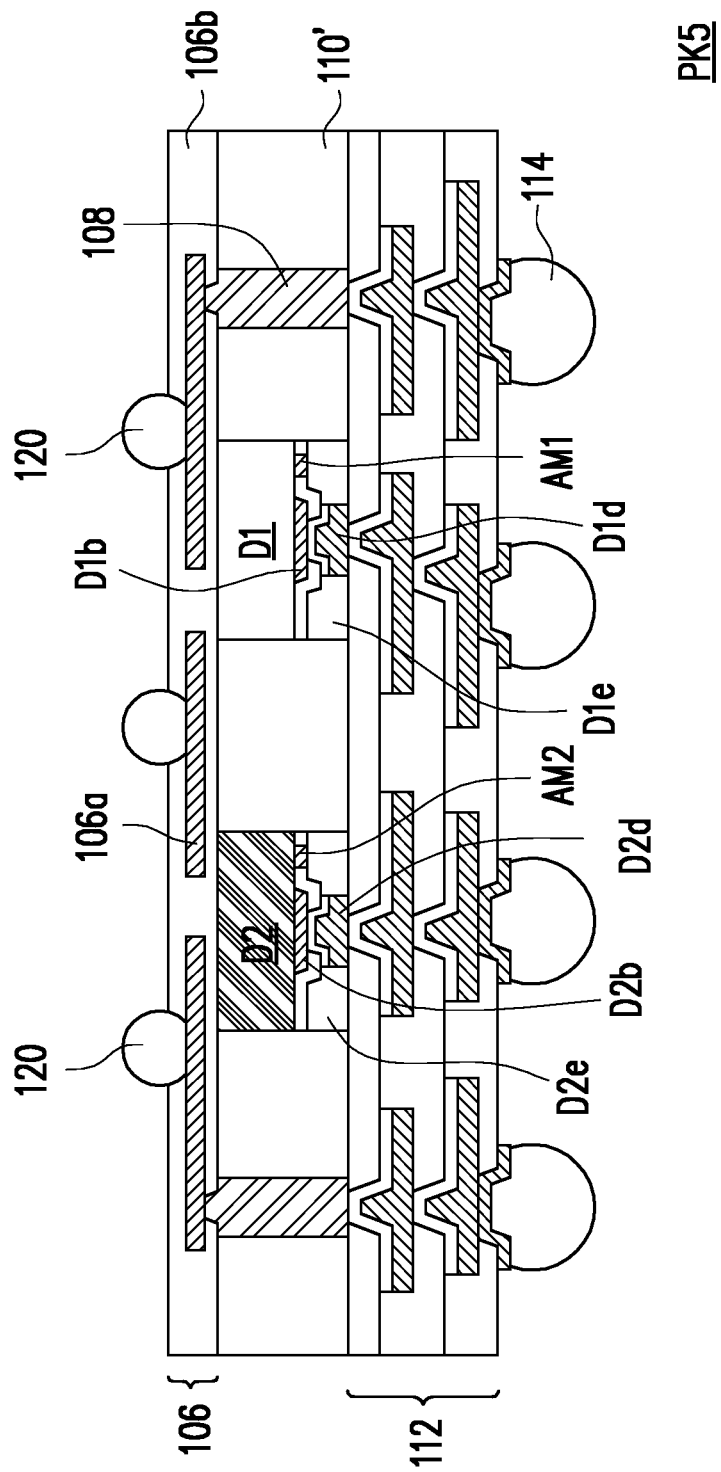
FIG. 11 is a schematic sectional view of a package structure in accordance with some alternative embodiments of the present disclosure.

FIG. 11 is a schematic sectional view of a package structure in accordance with some alternative embodiments of the present disclosure. The package structure PK5 illustrated in FIG. 11 is similar to the package structure PK3 illustrated in FIG. 6C, hence the same reference numerals are used to refer to the same or liked parts, and its detailed description will be omitted herein. The difference between the embodiments is that the first semiconductor die D1 and the second semiconductor die D2 prepared in FIG. 10B are used instead. In other words, the first alignment mark AM1 and the first conductive pads D1b are located at the same level on the first semiconductor substrate D1a. Furthermore, the second alignment mark AM2 and the second conductive pads D2b are located at the same level on the second semiconductor substrate D2a. Similar to the embodiments above, since each of the first semiconductor die D1 and the second semiconductor die D2 includes at least one alignment mark (first alignment mark AM1 and second alignment mark AM2) used for the alignment process, the relative positions of the first semiconductor die D1 to the second semiconductor die D2 can be appropriately controlled, and the overlay accuracy of the package structure can be improved.

Figure 12:
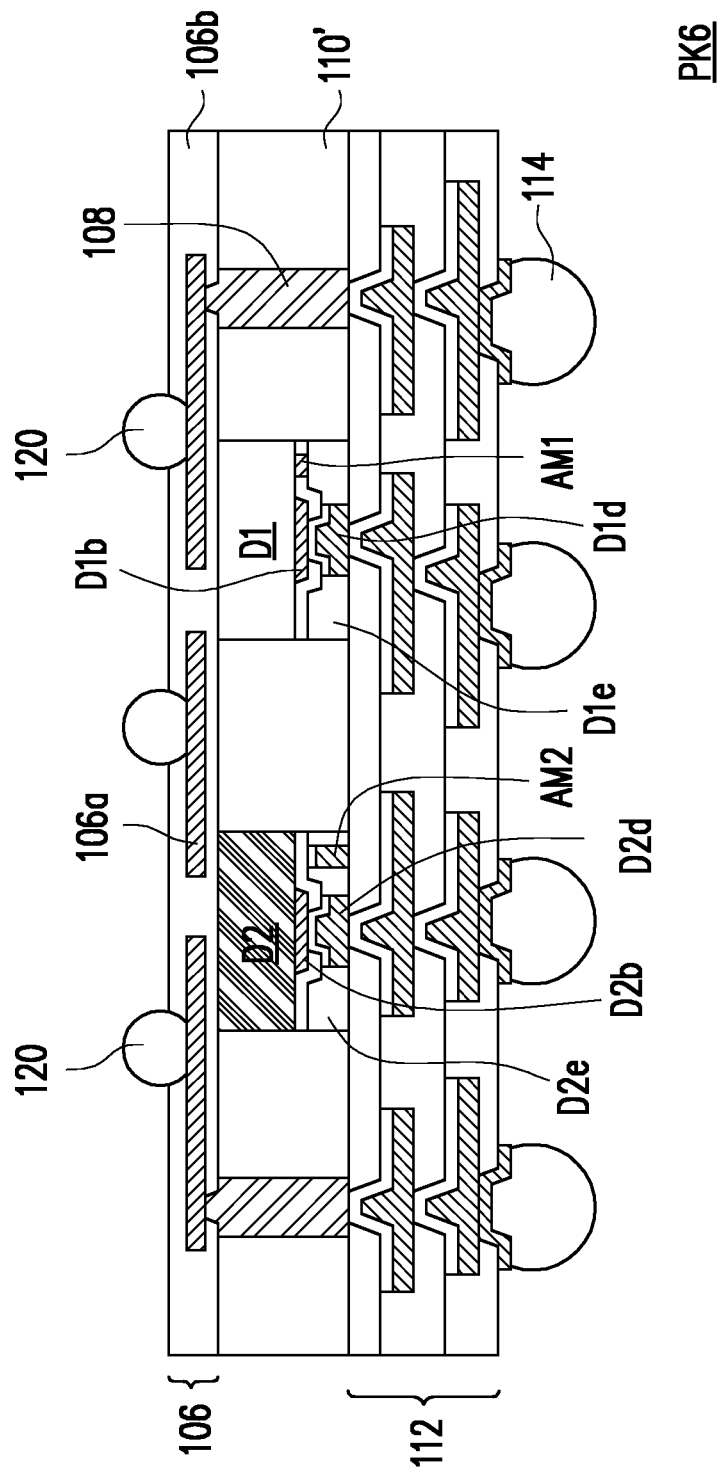
FIG. 12 is a schematic sectional view of a package structure in accordance with some alternative embodiments of the present disclosure.

FIG. 12 is a schematic sectional view of a package structure in accordance with some alternative embodiments of the present disclosure. The package structure PK6 illustrated in FIG. 12 is similar to the package structure PK5 illustrated in FIG. 11, hence the same reference numerals are used to refer to the same or liked parts, and its detailed description will be omitted herein. The difference between the embodiments is in the position of the second alignment mark AM2. In the above embodiments, the position of the alignment mark (AM1/AM2) on the semiconductor substrate is the same for the first semiconductor die D1 and the second semiconductor die D2. However, the disclosure is not limited thereto. Referring to FIG. 12, in the first semiconductor die D1, the first alignment mark AM1 and the first conductive pads D1*b* are located at the same level on the first semiconductor substrate D1*a*, whereas in the second semiconductor die D2, the second alignment mark AM2 and the second conductive posts D2*d* are located at the same level on the second semiconductor substrate D2*a*. In other words, the alignment marks (AM1/AM2) may be located at the pad-level or at the post-level depending on actual design requirements. Similar to the embodiments above, since each of the first semiconductor die D1 and the second semiconductor die D2 includes at least one alignment mark (first alignment mark AM1 and second alignment mark AM2) used for the alignment process, the relative positions of the first semiconductor die D1 to the second semiconductor die D2 can be appropriately controlled, and the overlay accuracy of the package structure can be improved.

Figure 13A:
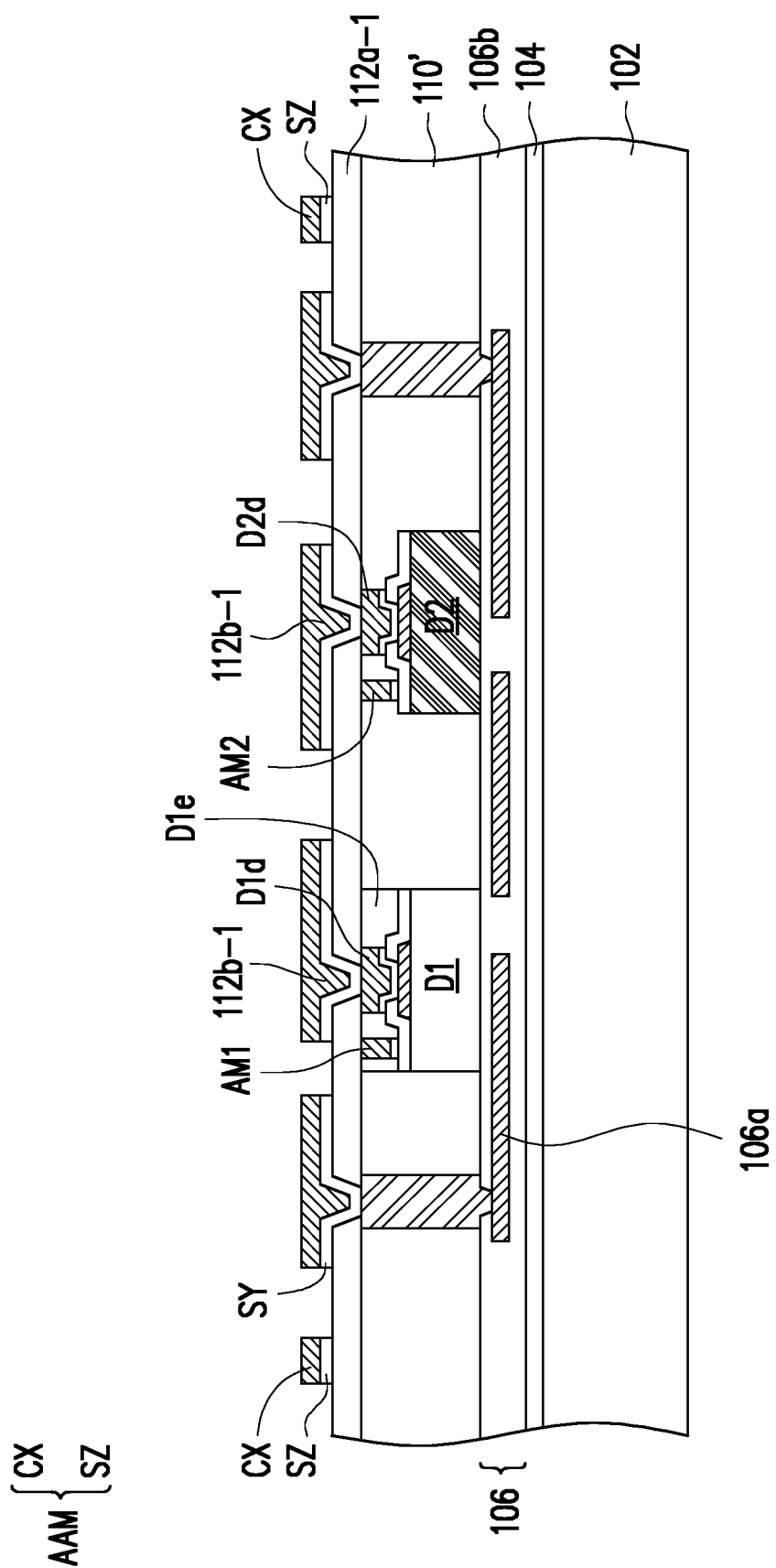
FIG. 13A to FIG. 13C are schematic sectional views of various stages in a method of fabricating a package structure in accordance with some alternative embodiments of the present disclosure.
Figure 13B:
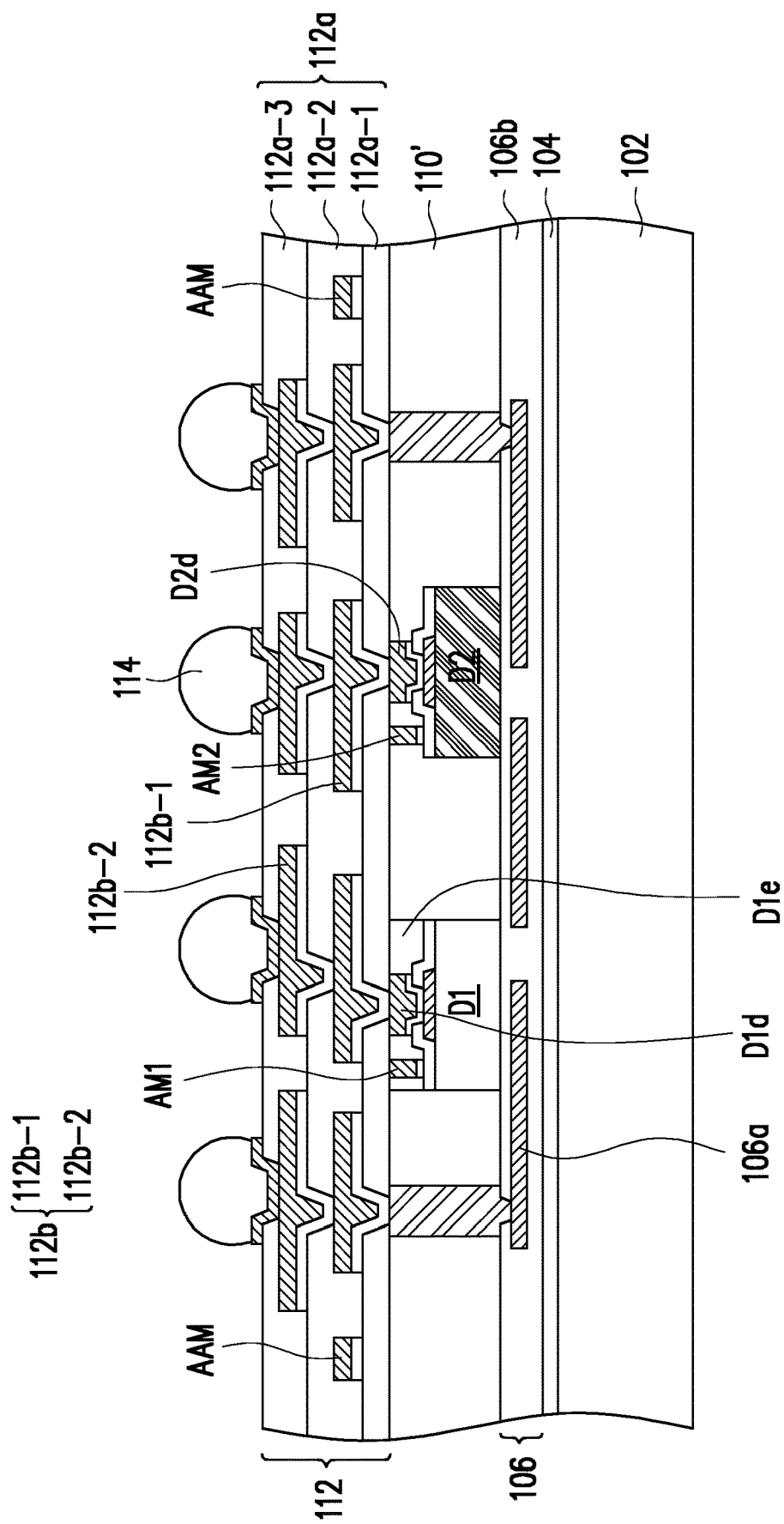
Figure 13C:
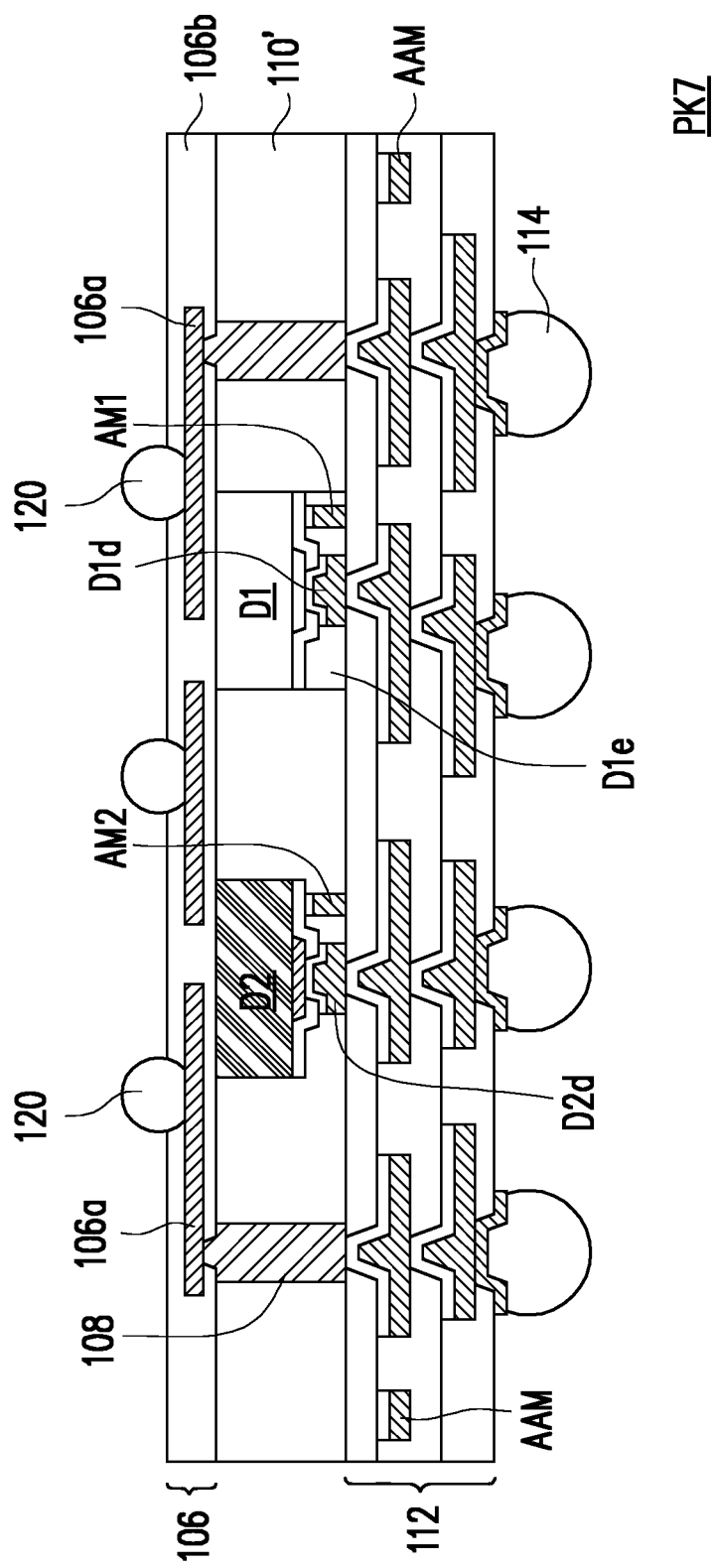

FIG. 13A to FIG. 13C are schematic sectional views of various stages in a method of fabricating a package structure in accordance with some alternative embodiments of the present disclosure. The method of fabricating the package structure PK7 shown in FIG. 13C is similar to the method of fabricating the package structure PK3 as described in FIG. 6A to FIG. 6C. Therefore, the same reference numerals are used to refer to the same or liked parts, and its detailed description will be omitted herein. The difference between the embodiments is that auxiliary alignment marks AAM are further formed on the redistribution layer 112.

Referring to FIG. 13A, the redistribution layer 112 is formed by first forming a first dielectric layer 112*a*-1 having contact openings revealing the first conductive posts D1*d* and the second conductive posts D2*d*. Subsequently, a first conductive layer 112*b*-1 is formed within the contact openings and over the first dielectric layer 112*a*-1. In the exemplary embodiment, auxiliary alignment marks AAM are formed in the same steps of forming the first conductive layer 112*b*-1. In certain embodiments, the auxiliary alignment marks AAM are formed with a seed layer SZ and a conductive body CX. In some embodiments, the seed layer SZ and the seed layer SY are formed together in the same steps. Furthermore, the conductive body CX and the first conductive layer 112*b*-1 are formed together in the same steps, and the conductive body CX and the first conductive layer 112*b*-1 are made of the same materials. In the exemplary embodiment, the auxiliary alignment marks AAM are formed with a plurality of stripe patterns. For example, the auxiliary alignment marks AAM may be any one of the designs shown in FIG. 4A to FIG. 4D.

Referring to FIG. 13B, in a next step, a second dielectric layer 112*a*-2, a second conductive layer 112*b*-2 and a third dielectric layer 112*a*-3 are sequentially formed in the same way as in FIG. 6B. Thereafter, the same steps described in FIG. 2D may be performed to form the conductive pads 112*c* and the conductive balls 114 on the redistribution layer 112. In the exemplary embodiment, the auxiliary alignment marks AAM are only formed on the first dielectric layer 112*a*-1. However, the disclosure is not limited thereto, in some other embodiments, the auxiliary alignment marks AAM may be formed on any of the first dielectric layer 112*a*-1, the second dielectric layer 112*a*-2 and/or the third dielectric layer 112*a*-3.

Referring to FIG. 13C, in a next step, the carrier 102 is debonded so as to separate the de-bonding layer 104 and the other elements formed thereon from the carrier 102. Subsequently, the dielectric layer 106*b* of the backside redistribution layer 106 may be patterned to form a plurality of openings that expose the conductive layers 106*a*, and a plurality of conductive balls 120 may be placed on the surface of the conductive layers 106*a* exposed by the openings. The structure may then be diced or singulated to form a plurality of package structures PK7. Similar to the embodiments above, since each of the first semiconductor die D1 and the second semiconductor die D2 includes at least one alignment mark (first alignment mark AM1 and second alignment mark AM2), the relative positions of the first semiconductor die D1 to the second semiconductor die D2 can be appropriately controlled, and the overlay accuracy of the package structure can be improved. Furthermore, by forming the redistribution layer 112 having the auxiliary alignment marks AAM, the subsequently formed elements may be accurately formed on the designated location with high overlay accuracy, thereby enhancing the reliability of the package structure.

Figure 14:
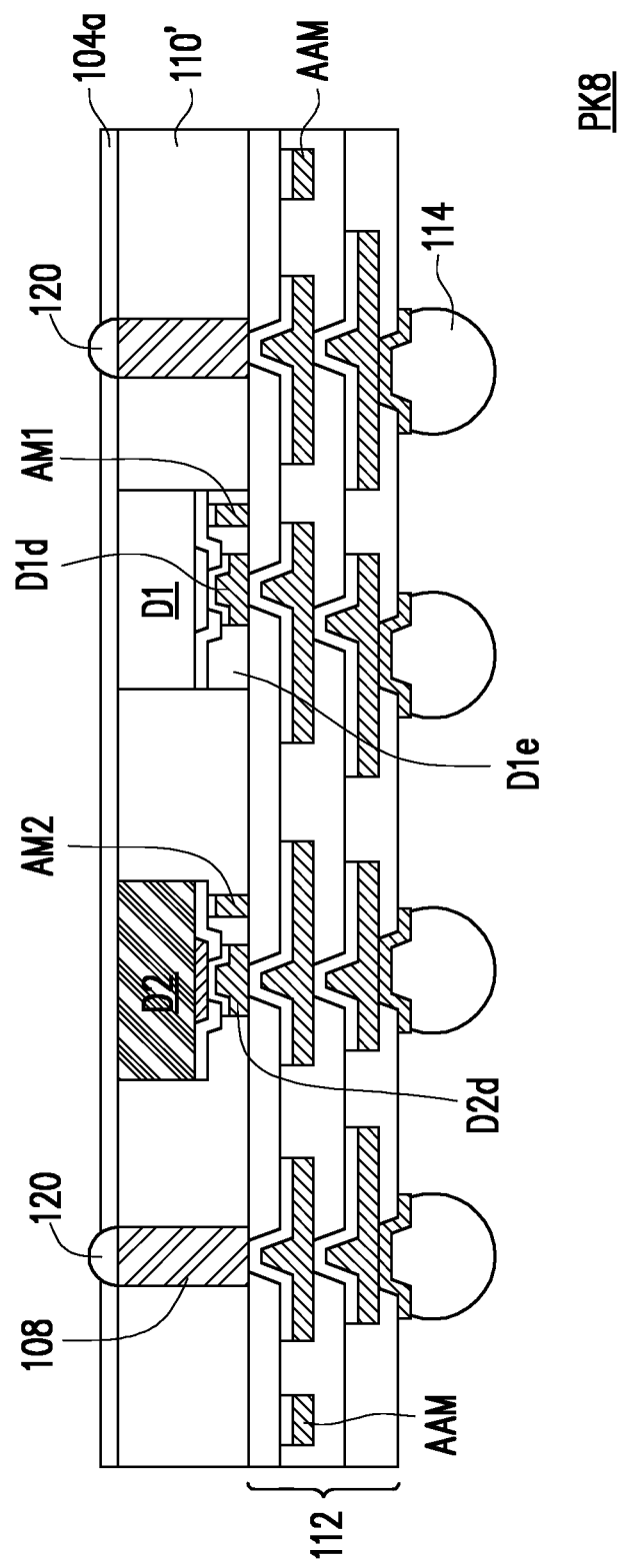
FIG. 14 is a schematic sectional view of a package structure in accordance with some alternative embodiments of the present disclosure.

FIG. 14 is a schematic sectional view of a package structure in accordance with some alternative embodiments of the present disclosure. The package structure PK8 illustrated in FIG. 14 is similar to the package structure PK7 illustrated in FIG. 13C, hence the same reference numerals are used to refer to the same or liked parts, and its detailed description will be omitted herein. The difference between the embodiments is that the backside redistribution layer 106 is omitted from FIG. 14. In the above embodiments, all of the first semiconductor dies D1 and the second semiconductor dies D2 are bonded onto the backside redistribution layer 106. However, the disclosure is not limited thereto. Referring to FIG. 14, the first semiconductor die D1 and the second semiconductor die D2 are bonded onto a dielectric layer 104. In some embodiments, the dielectric layer 104 may be patterned to form a plurality of openings that expose the through insulator vias 108. Thereafter, a plurality of conductive balls 120 may be placed on the surface of the through insulator vias 108 exposed by the openings. As such, a package structure PK8 having dual side terminals is accomplished.

As illustrated in FIG. 14, since each of the first semiconductor die D1 and the second semiconductor die D2 includes at least one alignment mark (first alignment mark AM1 and second alignment mark AM2) used for the alignment process, the relative positions of the first semiconductor die D1 to the second semiconductor die D2 can be appropriately controlled, and the overlay accuracy of the package structure can be improved. Furthermore, by forming the redistribution layer 112 having the auxiliary alignment marks AAM, the subsequently formed elements may be accurately formed on the designated location with high overlay accuracy, thereby enhancing the reliability of the package structure.

Figure 15:
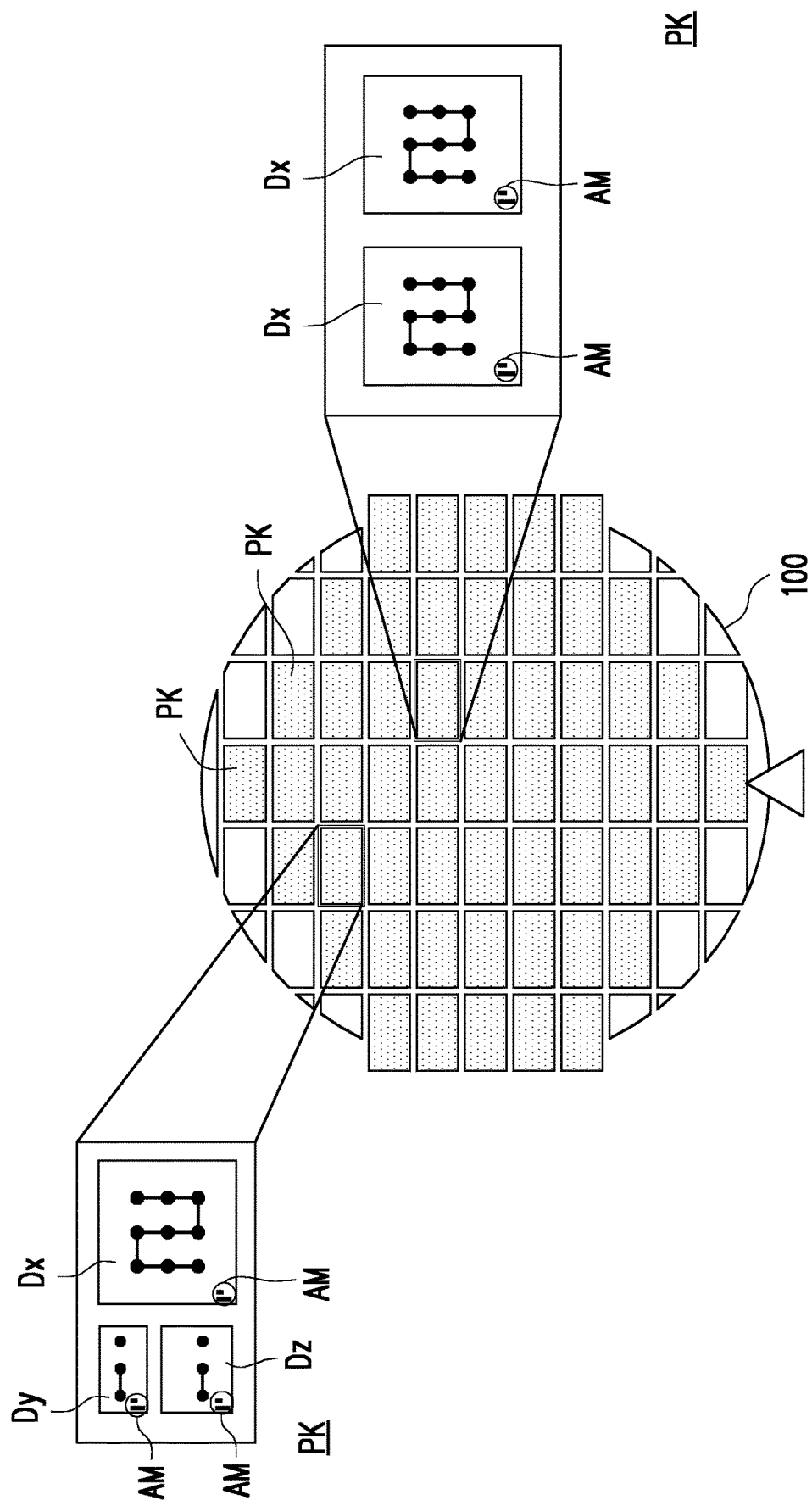
FIG. 15 is a schematic top view illustrating the arrangement of package structures on a semiconductor wafer in accordance with some embodiments of the present disclosure.

FIG. 15 is a schematic top view illustrating the arrangement of package structures on a semiconductor wafer in accordance with some embodiments of the present disclosure. Referring to FIG. 15, each of the package structures prepared in the above embodiments may be fabricated on a semiconductor wafer. For example, the semiconductor wafer may be diced to form a plurality of package structures PK. In the exemplary embodiment, the number of semiconductor dies disposed on each of the package structure PK is not limited thereto, and this can be adjusted based on design requirement. For instance, in one embodiment, a package structure PK may contain two semiconductor dies Dx being the same type of semiconductor dies. In another embodiment, a package structure PK may contain a first semiconductor die Dx, a second semiconductor die Dy and a third semiconductor die Dz, wherein these semiconductor dies are different types of semiconductor dies. Since each of the semiconductor dies (Dx, Dy or Dz) in the package structure PK respectively includes at least one alignment mark AM used for alignment, the semiconductor dies Dx may be picked and placed on the semiconductor wafer with high overlay accuracy and reduced field shift error.

In the above-mentioned embodiments, each of semiconductor dies in the package structure includes at least one alignment mark, therefore, the relative positions of the semiconductor dies (die to die position) can be appropriately controlled, and the overlay accuracy of the package structure can be improved. As such, the semiconductor dies may be picked and placed on the semiconductor wafer with high overlay accuracy and reduced field shift error.

In some embodiments of the present disclosure, a package structure includes a plurality of semiconductor die, an insulating encapsulant and a redistribution layer. Each of the plurality of semiconductor dies includes a semiconductor substrate, conductive pads disposed on the semiconductor substrate, conductive posts disposed on the conductive pads, and at least one alignment mark located on the semiconductor substrate. The insulating encapsulant is encapsulating the plurality of semiconductor dies. The redistribution layer is disposed on the insulating encapsulant and electrically connected to the plurality of semiconductor dies.

In another embodiment of the present disclosure, a package structure includes a first semiconductor die, a second semiconductor die, an insulating encapsulant and a redistribution layer. The first semiconductor die includes a first semiconductor substrate, first conductive pads disposed on the first semiconductor substrate, first conductive posts disposed on the first conductive pads, and a first alignment mark located on the first semiconductor substrate, the first alignment mark includes first stripe patterns. The second semiconductor die includes a second semiconductor substrate, second conductive pads disposed on the semiconductor substrate, second conductive posts disposed on the second conductive pads, and a second alignment mark located on the second semiconductor substrate, the second alignment mark of the second semiconductor die includes second stipe patterns. The insulating encapsulant is encapsulating the first semiconductor die and the second semiconductor die. The redistribution layer is disposed on the insulating encapsulant and electrically connected to the first semiconductor die and the second semiconductor die.

In yet another embodiment of the present disclosure, a method of fabricating a package structure is described. The method includes the following steps. A first semiconductor substrate having first conductive pads formed thereon is provided. A first passivation layer with first openings is formed over the first conductive pads. First conductive posts are formed within the first openings and over the first conductive pads. First alignment mark is formed to be located on the first passivation layer. Dicing is performed to obtain first semiconductor dies. A second semiconductor die is provided. The second semiconductor die has a second semiconductor substrate having second conductive pads formed thereon, a second passivation layer covering the second conductive pad and having a second opening exposing the second conductive pads, second conductive posts disposed on the second conductive pads within the second opening, and a bulk alignment mark located on the second passivation layer. A second alignment mark is formed on the second passivation layer, wherein the bulk alignment mark is etched to form an undercut during forming the second alignment mark. The first semiconductor die is placed onto a carrier, and a first alignment process is performed using the first alignment mark for alignment. The second semiconductor die is placed beside the first semiconductor die, and a second alignment process is performed using the second alignment mark for alignment. An insulating encapsulant is formed over the carrier and encapsulating the first semiconductor die and the second semiconductor die. A redistribution layer is formed on the insulating encapsulant, wherein the redistribution layer is electrically connected to the first semiconductor die and the second semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    a first semiconductor die comprising:
        a first substrate;
        conductive pads disposed on the first substrate;
        conductive posts disposed on the conductive pads;
        a first alignment mark located on the first substrate; and
        a protection layer covering and contacting the first alignment mark;
    a second semiconductor die disposed aside the first semiconductor die and comprising:
        a second substrate;
        second conductive pads disposed on the second substrate;
        second conductive posts disposed on the second conductive pads; and
        a second alignment mark located on the second substrate;
    an insulating encapsulant encapsulating the first semiconductor die and the second semiconductor die, wherein the insulating encapsulant is in physical contact with the second alignment mark of the second semiconductor die, and is physically separated from the first alignment mark of the first semiconductor die by the protection layer.

2. The structure according to claim 1, wherein a top surface of the insulating encapsulant is coplanar with top surfaces of the first alignment mark, the conductive posts, the second alignment mark and the second conductive posts.

3. The structure according to claim 1, wherein the second semiconductor die further comprises a bulk alignment mark located on the second substrate, and wherein the second alignment mark and the bulk alignment mark are located at two opposite sides of the second semiconductor die.

4. The structure according to claim 3, wherein the bulk alignment mark has a top section and a bottom section, and the bottom section of the bulk alignment mark has an undercut.

5. The structure according to claim 1, wherein the first alignment mark and the second alignment mark comprises a plurality of stripe patterns.

6. The structure according to claim 5, wherein the plurality of stripe patterns together forms a square-shaped grid pattern having a L-shaped hollow portion arranged therein.

7. The structure according to claim 1, further comprising:
a first redistribution layer disposed on and electrically connected to the first semiconductor die and the second semiconductor die; and
a plurality of conductive balls disposed on and electrically connected to the first redistribution layer.

8. The structure according to claim 7, further comprising:
a second redistribution layer disposed on a backside of the first semiconductor die and the second semiconductor die; and
through insulator vias electrically connecting the first redistribution layer to the second redistribution layer.

9. A structure, comprising:
a first semiconductor die, comprising:
a conductive post disposed over a conductive pad;
a first alignment mark and a bulk alignment mark disposed on two opposing sides of the conductive post, wherein the first alignment mark include stripe patterns, and the bulk alignment mark comprises a seed layer and a conductive body disposed on the seed layer, and the seed layer of the bulk alignment mark has an undercut;
an insulating encapsulant encapsulating the first semiconductor die, wherein the insulating encapsulant is physically contacting the first alignment mark and the bulk alignment mark; and
a redistribution layer disposed on and electrically connected to the conductive post of the first semiconductor die.

10. The structure according to claim 9, wherein the first semiconductor die further comprises a passivation layer partially covering the conductive pad, and wherein the conductive post, the first alignment mark and the bulk alignment mark are disposed on the passivation layer.

11. The structure according to claim 10, wherein the seed layer of the bulk alignment mark having the undercut is in direct contact with the passivation layer.

12. The structure according to claim 9, wherein the bulk alignment mark is formed with a L-shaped pattern, and the stripe patterns of the first alignment mark are arranged to form a square-shaped grid pattern having a L-shaped hollow portion therein.

13. The structure according to claim 9, further comprising:
a second semiconductor die arranged aside the first semiconductor die and embedded in the insulating encapsulant, wherein the second semiconductor die comprises:
a second conductive post disposed over a second conductive pad; and
a second alignment mark disposed aside the second conductive post, wherein the second alignment mark include stripe patterns, and wherein the second semiconductor die is free of any bulk alignment mark.

14. The structure according to claim 13, wherein the second semiconductor die further comprises a protection layer surrounding the second conductive post and the second alignment mark, and physically separating the second conductive post and the second alignment mark from the insulating encapsulant.

15. The structure according to claim 9, wherein the redistribution layer comprises a dielectric layer and a conductive layer, the conductive layer is electrically connected to the conductive post of the first semiconductor die, and the dielectric layer is covering and contacting top surfaces of the first alignment mark and the bulk alignment mark.

16. A structure, comprising:
a first semiconductor die comprising a first conductive post and a first alignment mark disposed aside the first conductive post;
a second semiconductor die comprising a second conductive post and two alignment marks disposed aside the second conductive post, wherein the two alignment marks have different patterns, and the two alignment marks of the second semiconductor die includes an alignment mark having stripe patterns and a bulk alignment mark having an undercut;
a dielectric layer disposed on the first semiconductor die and the second semiconductor die, and physically contacting and covering top surfaces of the first alignment mark and the two alignment marks;
a conductive layer disposed on the dielectric layer and electrically connected to the first conductive post and the second conductive post, wherein the conductive layer is electrically isolated from the first alignment mark of the first semiconductor die and the two alignment marks of the second semiconductor die.

17. The structure according to claim 16, further comprising a plurality of through insulator vias surrounding the first semiconductor die and the second semiconductor die, wherein the conductive layer is electrically connected to the plurality of through insulator vias.

18. The structure according to claim 16, further comprising an insulating encapsulant encapsulating the first semiconductor die and the second semiconductor die, wherein the insulating encapsulant is physically contacting side surfaces of the two alignment marks of the second semiconductor die.

19. The structure according to claim 16, further comprising a backside redistribution layer disposed below the first semiconductor die and the second semiconductor die, wherein the backside redistribution layer is electrically connected to the conductive layer.

20. The structure according to claim 16, further comprising a protection layer laterally surrounding the first conductive post and the first alignment mark of the first semiconductor die.

* * * * *